United States Patent
Kim et al.

(10) Patent No.: US 9,921,749 B2
(45) Date of Patent: *Mar. 20, 2018

(54) MEMORY SYSTEM AND METHOD INCLUDING DETERMINING A READ VOLTAGE BASED ON PROGRAM ORDER INFORMATION AND A PLURALITY OF MAPPING TABLES

(71) Applicant: SAMSUNG ELECTRONICS CO., LTD., Suwon-si, Gyeonggi-do (KR)

(72) Inventors: Kyung-Ryun Kim, Seoul (KR); Joon-Suc Jang, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 122 days.

This patent is subject to a terminal disclaimer.

(21) Appl. No.: 14/743,458

(22) Filed: Jun. 18, 2015

(65) Prior Publication Data

US 2016/0124642 A1    May 5, 2016

(30) Foreign Application Priority Data

Oct. 29, 2014 (KR) ........................ 10-2014-0148439

(51) Int. Cl.
*G06F 3/06* (2006.01)
*G06F 12/02* (2006.01)
(Continued)

(52) U.S. Cl.
CPC ............ *G06F 3/061* (2013.01); *G06F 3/0653* (2013.01); *G06F 3/0673* (2013.01);
(Continued)

(58) Field of Classification Search
CPC ...... G06F 3/061; G06F 3/0653; G06F 3/0673; G06F 12/0246; G06F 12/0238;
(Continued)

(56) References Cited

U.S. PATENT DOCUMENTS 6,678,785 B2    1/2004 Lasser
7,012,835 B2    3/2006 Gonzalez et al.
(Continued)

FOREIGN PATENT DOCUMENTS

JP    2006133923    5/2006
JP    2008097705    4/2008
(Continued)

OTHER PUBLICATIONS

Desnoyers, Peter, "Analytic Modeling of SSD Write Performance", SYSTOR '12 Jun. 4-6, 2012, pp. 1-10.

*Primary Examiner* — Mark Giardino, Jr.
*Assistant Examiner* — Glenn Gossage
(74) *Attorney, Agent, or Firm* — Volentine & Whitt, PLLC

(57) ABSTRACT

A method of operating a memory system, including a memory device, includes managing program order information of the memory device based on a program order stamp (POS) indicating a relative temporal relationship between program operations of a plurality of memory groups that are included in the memory device. The method includes generating a first mapping table that stores a read voltage offset and an upper POS corresponding to the read voltage offset, by using a plurality of voltage levels that are sequentially decreased or reduced, and generating a second mapping table that stores the read voltage offset and a lower POS corresponding to the read voltage offset, by using a plurality of voltage levels that are sequentially increased. A read voltage for performing a read operation on the memory device is variably determined based on the first and second mapping tables and the program order information.

16 Claims, 37 Drawing Sheets

(51) Int. Cl.
*G11C 16/34* (2006.01)
*G11C 16/04* (2006.01)
*G11C 16/26* (2006.01)
*G11C 11/56* (2006.01)

(52) U.S. Cl.
CPC .......... *G11C 16/0483* (2013.01); *G11C 16/26* (2013.01); *G11C 16/349* (2013.01); *G06F 12/0246* (2013.01); *G11C 11/5642* (2013.01); *G11C 16/34* (2013.01)

(58) Field of Classification Search
CPC ............ G06F 3/0619; G06F 2212/7209; G11C 16/26; G11C 16/34; G11C 11/5642
See application file for complete search history.

(56) References Cited

U.S. PATENT DOCUMENTS

| | | | |
|---|---|---|---|
| 7,649,776 B2 | 1/2010 | Abiko et al. | |
| 7,908,423 B2 | 3/2011 | Hsu et al. | |
| 8,072,805 B2 | 12/2011 | Chou et al. | |
| 8,205,033 B2 | 6/2012 | Saeki et al. | |
| 8,248,856 B2 | 8/2012 | Goss et al. | |
| 8,255,614 B2 | 8/2012 | Omizo et al. | |
| 8,264,882 B2 | 9/2012 | Moschiano et al. | |
| 8,456,911 B2 | 6/2013 | Yuan et al. | |
| 8,665,645 B2 | 3/2014 | Avraham et al. | |
| 8,737,136 B2 | 5/2014 | Cometti | |
| 8,743,604 B2 | 6/2014 | Chae | |
| 2009/0265403 A1 | 10/2009 | Fukumoto | |
| 2012/0268994 A1 | 10/2012 | Nagashima | |
| 2012/0294104 A1 | 11/2012 | Mun et al. | |
| 2013/0073788 A1 | 3/2013 | Post et al. | |
| 2013/0159610 A1 | 6/2013 | Kawamura | |
| 2014/0092682 A1 | 4/2014 | Yu et al. | |
| 2014/0143630 A1* | 5/2014 | Mu | G06F 11/1048 714/763 |
| 2014/0173172 A1* | 6/2014 | Yang | G06F 12/0246 711/102 |
| 2014/0229131 A1 | 8/2014 | Cohen et al. | |
| 2014/0229774 A1* | 8/2014 | Melik-Martirosian | G06F 11/076 714/704 |
| 2014/0281119 A1 | 9/2014 | Hyun et al. | |
| 2014/0359202 A1* | 12/2014 | Sun | G11C 16/34 711/103 |
| 2015/0179284 A1* | 6/2015 | Alrod | G06F 11/076 714/704 |

FOREIGN PATENT DOCUMENTS

| | | |
|---|---|---|
| JP | 2008276832 | 11/2008 |
| JP | 2011070735 | 4/2011 |
| JP | 2011095853 | 5/2011 |
| JP | 2012123498 | 6/2012 |
| KR | 20100022229 | 3/2010 |
| KR | 20100117906 A | 11/2010 |
| KR | 20140021909 A | 2/2014 |

* cited by examiner

FIG. 12

TABLE1

121

| ADDR | POS |
|------|-----|
| 0 | 0 |
| 1 | 0 |
| 2 | 1 |
| ... | ... |
| N-1 | 0 |
| N | 0 |

⇒

122

| ADDR | POS |
|------|-----|
| 0 | 29434 |
| 1 | 24679 |
| ... | ... |
| K | 30000 |
| ... | ... |
| N | 22435 |

FIG. 13

TABLE2

| POS | ADDR |
|-----|------|
| 1 | 2843 |
| 2 | 173 |
| ... | ... |
| M | 27 |

| INDEX | ADDR |
|---|---|
| 0 | 10 |
| 1 | 1457 |
| 2 | 1 |
| 3 | 73 |
| 4 | 325 |
| 5 | 10 |
| ... | ... |
| M | 27 |

| offset | −40mV | −80mV |
|---|---|---|
| POS | 153 | 0 |

211

| offset | −40mV | −80mV |
|---|---|---|
| POS | 153 | 70 |

| offset | −40mV | −80mV |
|---|---|---|
| POS | 0 | 130 |

241

| offset | −40mV | −80mV |
|--------|-------|-------|
| POS    | 391   | 130   |

251

MEMORY SYSTEM AND METHOD INCLUDING DETERMINING A READ VOLTAGE BASED ON PROGRAM ORDER INFORMATION AND A PLURALITY OF MAPPING TABLES

CROSS-REFERENCE TO RELATED APPLICATION

This application claims the benefit of Korean Patent Application No. 10-2014-0148439, filed on Oct. 29, 2014, in the Korean Intellectual Property Office, the disclosure of which is incorporated herein in its entirety by reference.

BACKGROUND

The inventive concept relates to a memory device, and more particularly, to a memory device, a memory system, a method of operating the memory device, and a method of operating the memory system.

Memory devices that are used to store data are classified into volatile memory devices and nonvolatile memory devices. Flash memory devices that are nonvolatile memory devices may be used in mobile phones, digital cameras, personal digital assistants (PDAs), portable computers, fixed computers, and other devices. The nonvolatile memory devices may need to be controlled to operate adaptively in view of data retention characteristics to improve the reliability thereof.

SUMMARY

According to an aspect of the inventive concept, there is provided a method of operating a memory system including a memory device, the method including managing program order information of the memory device based on a program order stamp (POS) indicating a relative temporal relationship between program operations of a plurality of memory groups that are included in the memory device, and generating a first mapping table that stores a read voltage offset and an upper POS corresponding to the read voltage offset, by using a plurality of voltage levels that are sequentially reduced. The method further includes generating a second mapping table that stores the read voltage offset and a lower POS corresponding to the read voltage offset, by using a plurality of voltage levels that are sequentially increased, and variably determining a read voltage for performing a read operation on the memory device, based on the first and second mapping tables and the program order information.

According to another aspect of the inventive concept, there is provided a method of operating a memory device including a plurality of memory groups, the method including storing program order information that includes a program order stamp (POS) indicating a relative temporal relationship between program operations of the plurality of memory groups, storing a first mapping table that stores a read voltage offset and an upper POS corresponding to the read voltage offset and a second mapping table that stores the read voltage offset and a lower POS corresponding to the read voltage offset, and variably determining a read voltage for performing a read operation on the plurality of memory groups, based on the first and second mapping tables and the program order information.

According to another aspect of the inventive concept, there is provided a memory system including a memory device having a plurality of memory groups, and a memory controller configured to control the memory device. The memory controller includes a program order manager configured to manage program order information of the memory device based on a program order stamp (POS) indicating a relative temporal relationship between program operations of the plurality of memory groups, and a mapping table generator configured to generate a first mapping table that stores a read voltage offset and an upper POS corresponding to the read voltage offset by using a plurality of voltage levels that are sequentially reduced, and generate a second mapping table that stores the read voltage offset and a lower POS corresponding to the read voltage offset by using a plurality of voltage levels that are sequentially increased. The memory controller further includes a read voltage determiner configured to determine a read voltage for performing a read operation on the memory device based on the first and second mapping tables and the program order information.

BRIEF DESCRIPTION OF THE DRAWINGS

Exemplary embodiments of the inventive concept will be more clearly understood from the following detailed description taken in conjunction with the accompanying drawings in which reference numerals denote structural elements and:

FIG. 12 is a table that stores program order information, according to an exemplary embodiment;

FIG. 13 is a table that stores program order information, according to another exemplary embodiment;

FIGS. 20A through 22B are diagrams for sequentially explaining an operation of generating a first mapping table, according to an exemplary embodiment;

FIGS. 23A through 25B are diagrams for sequentially explaining an operation of generating a second mapping table, according to an exemplary embodiment;

DETAILED DESCRIPTION OF THE EMBODIMENTS

Figure 1:
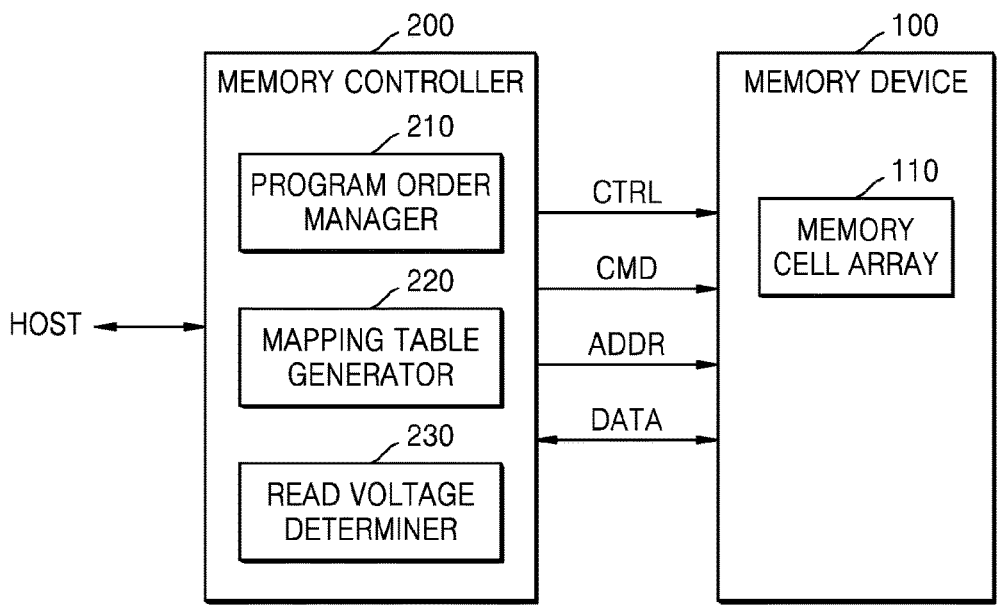
FIG. 1 is a block diagram illustrating a memory system according to an exemplary embodiment.

As used herein, the term "and/or" includes any and all combinations of one or more of the associated listed items. Expressions such as "at least one of," when preceding a list of elements, modify the entire list of elements and do not modify the individual elements of the list.

The inventive concept will now be described more fully with reference to the accompanying drawings, in which exemplary embodiments are shown. The inventive concept may, however, be embodied in many different forms and should not be construed as limited to the exemplary embodiments set forth herein. Rather, these embodiments are provided so that this disclosure will be thorough and complete, and will fully convey the scope of the inventive concept to one of ordinary skill in the art. As the inventive concept allows for various changes and numerous embodiments, exemplary embodiments will be illustrated in the drawings and described in detail in the written description. However, this is not intended to limit the inventive concept to particular modes of practice, and it is to be appreciated that all changes, equivalents, and substitutes that do not depart from the spirit and technical scope of the inventive concept are encompassed in the inventive concept. In the drawings, like reference numerals denote like elements and sizes of structures are exaggerated for clarity.

The terms used in the present specification are merely used to describe exemplary embodiments, and are not intended to limit the inventive concept. An expression used in the singular encompasses the expression of the plural, unless it has a clearly different meaning in the context. In the present specification, it is to be understood that the terms such as "including", "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a memory system 10 according to an exemplary embodiment.

Referring to FIG. 1, the memory system 10 may include a memory device 100 and a memory controller 200. The memory device 100 may include a memory cell array 110, and the memory controller 200 may include a program order manager 210, a mapping table generator 220, and a read voltage determiner 230.

Figure 2:
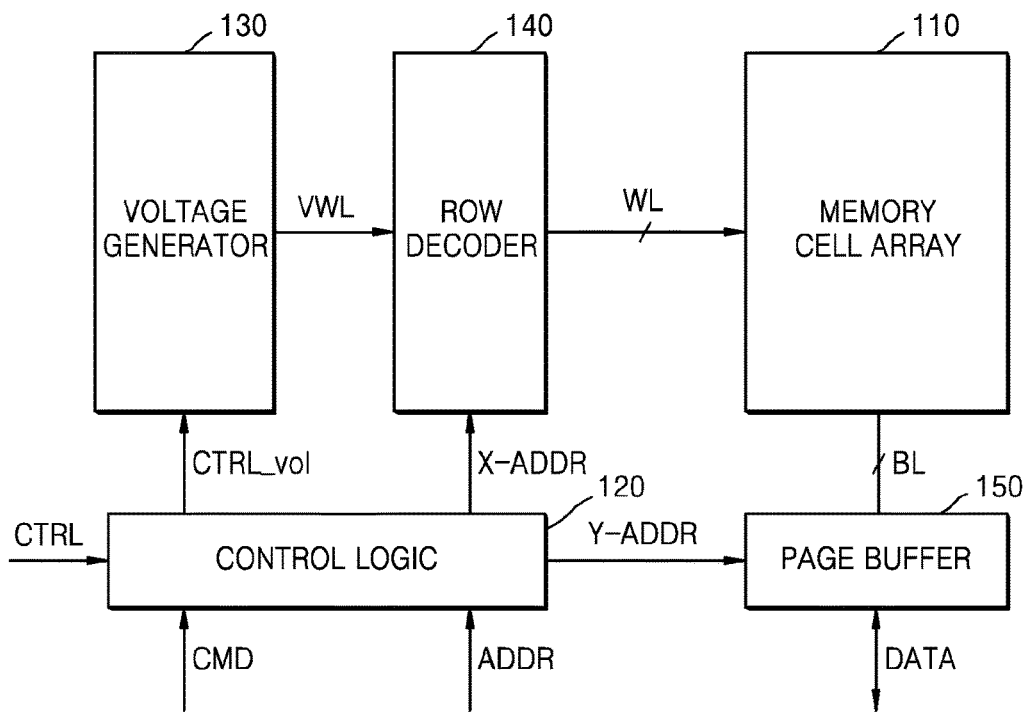
FIG. 2 is a detailed block diagram illustrating a memory device that is included in the memory system of FIG. 1, according to an exemplary embodiment.

The memory cell array 110 may include a plurality of memory cells (not shown) that are provided at intersections between a plurality of word lines WL (see FIG. 2) and a plurality of bit lines BL (see FIG. 2). In an exemplary embodiment, the plurality of memory cells may be flash memory cells, and the memory cell array 110 may be a NAND flash memory cell array or a NOR flash memory cell array.

The following exemplary embodiments will be explained on the assumption that the plurality of memory cells are NAND flash memory cells. For example, the plurality of memory cells may be two-dimensional (2D) horizontal NAND flash memory cells (see FIG. 4). Alternatively, the plurality of memory cells may be three-dimensional (3D) vertical NAND flash memory cells (see FIGS. 6 and 7). However, the inventive concept is not limited thereto, and in another exemplary embodiment, the plurality of memory cells may be resistive memory cells such as resistive random-access memory (RRAM) cells, phase change RAM (PRAM) cells, or magnetic RAM (MRAM) cells.

In the present exemplary embodiment, the memory cell array 110 may be divided into a plurality of memory groups, and each of the plurality of memory groups may include a plurality of memory cells. For example, the plurality of memory groups may be divided according to memory blocks. Alternatively, the plurality of memory groups may be divided according to word lines. Alternatively, the plurality of memory groups may be divided according to pages. Alternatively, the plurality of memory groups may be divided according to dies. However, the inventive concept is not limited thereto, and the plurality of memory groups may be divided according to arbitrary program units.

In an exemplary embodiment, each of memory cells that are included in the memory cell array 110 may be a single-level cell (SLC) that stores 1-bit data. In another exemplary embodiment, each memory cell of the memory cell array 110 may be a multi-level cell (MLC) that stores 2-bit data. In another exemplary embodiment, each memory cell of the memory cell array 110 may be a triple-level cell (TLC) that stores 3-bit data. However, the inventive concept is not limited thereto, and in another exemplary embodiment, each memory cell of the memory cell array 110 may store 4 or more bits of data.

The memory controller 200 may control the memory device 100 to read data that is stored in the memory device 100 or to write data to the memory device 100 in response to a read or write request from a host HOST. Also, the memory controller 200 may control the memory device 100 to perform, for example, an operation related to a sudden power-off, a read reclaim operation, or a wear leveling operation according to an internal request instead of a request from the host HOST. Such a control operation may be referred to as a background operation.

In detail, the memory controller 200 may control a program (or a write) operation, a read operation, and an erase operation of the memory device 100 by applying an address ADDR, a command CMD, and a control signal CTRL to the memory device 100. Also, data DATA for a program operation and read data DATA may be transmitted/received between the memory controller 200 and the memory device 100.

The program order manager 210 may manage program order information of the memory device 100 based on a program order stamp (POS) indicating a relative temporal relationship between program operations of the plurality of memory groups. The program order information may be information about a correlation between the plurality of memory groups and POSs.

In detail, when program operations or erase operations are sequentially or simultaneously performed on the plurality of memory groups, the program order manager 210 may allocate a POS indicating an order of a program operation or an erase operation to each of the plurality of memory groups. Next, the program order manager 210 may store the memory group on which the program operation or the erase operation is performed and the POS that is newly allocated. Next, once the POS is newly allocated, the program order manager 210 may update the program order information.

In an exemplary embodiment, the program order manager 210 may sequentially store POSs according to addresses of the plurality of memory groups to search for the POSs according to the addresses of the plurality of memory groups. In another exemplary embodiment, the program order manager 210 may store addresses of memory groups corresponding to POSs that are sequentially increased according to the POSs that are sequentially increased to search for the addresses of the plurality of memory groups according to the POSs that are sequentially increased.

In an exemplary embodiment, the program order manager 210 may store a POS of each memory group in an area of the memory group in the memory cell area 110. In another exemplary embodiment, the program order manager 210 may store a POS of each memory group in a Meta area in the memory cell array 110. In another exemplary embodiment, the program order manager 210 may store program order information that contains POSs of the plurality of memory groups in a Meta area in the memory cell array 110. In another exemplary embodiment, the program order manager 210 may temporarily store program order information that contains POSs of the plurality of memory groups in a buffer memory (not shown) in the memory controller 200.

In the present exemplary embodiment, since program order information is stored in the memory device 100 as described above, the program order information may be retained as non-volatile data. Accordingly, the program order information may be retained even when power supply to the memory system 10 is cut off, thereby further improving the performance and reliability of the memory device 100. Also, according to the present exemplary embodiment, since the program order information is temporarily stored in the memory controller 200 as described above, a speed at which the memory system 10 operates may be further increased.

The mapping table generator 220 may generate a first mapping table that stores a read voltage offset and an upper POS corresponding to the read voltage offset by using a plurality of voltage levels that are sequentially reduced (or decreased). Also, the mapping table generator 220 may generate a second mapping table that stores a read voltage offset and a lower POS corresponding to the read voltage offset by using a plurality of voltage levels that are sequentially increased. Also, the mapping table generator 220 may generate a third mapping table that stores a read voltage offset and a middle POS corresponding to the read voltage offset by using the first and second mapping tables.

The term 'read voltage offset' may refer to an offset of a read voltage that is initially set, that is, an offset to a default level, to perform a read operation on the memory device 100. The term 'POS corresponding to the read voltage offset' may refer to a POS that is allocated to a memory group whose read-out succeeds when a read operation is performed by using a read voltage to which the read voltage offset is applied.

In the present exemplary embodiment, the upper POS may be determined to be close to an upper bound level of a read voltage range. In the present exemplary embodiment, the lower POS may be determined to be close to a lower bound level of the read voltage. In the present exemplary embodiment, the middle POS may correspond to an average value of the upper POS and the lower POS.

When a specific event for the memory device 100 occurs, the mapping table generator 220 may generate or update the first through third mapping tables by using a result of the specific event. For example, when a read-out fails after a read operation is performed on the memory device 100, the mapping table generator 220 may generate or update the first through third mapping tables by using a result of the read operation. Alternatively, when a read retry operation for searching for a valley between adjacent two distributions is performed on the memory device 100, the mapping table generator 220 may generate or update the first through third mapping tables by using a result of the read retry operation.

In an exemplary embodiment, the first through third mapping tables may further store an address of a memory group corresponding to each POS. In an exemplary embodiment, when the memory groups are divided according to memory blocks, the first through third mapping tables may store a read voltage offset, a POS corresponding to the read voltage offset, and an address of a memory block corresponding to the POS. In another exemplary embodiment, when the memory groups are divided according to word lines, the first through third mapping tables may store a read voltage offset, a POS corresponding to the read voltage offset, an address of a memory block corresponding to the POS, and an address, that is, an index, of a corresponding word line corresponding to the address of the memory block.

The first through third mapping tables may be managed according to dies, memory blocks, word lines, pages, or data types. In an exemplary embodiment, each of the first through third mapping tables may be managed according to each of a plurality of dies that are included in the memory cell array 110, and in another exemplary embodiment, each of the first through third mapping tables may be collectively managed according to the plurality of dies that are included in the memory cell array 110. In an exemplary embodiment, each of the first through third mapping tables may be managed according to each of a plurality of pages, and in another exemplary embodiment, each of the first through third mapping tables may be collectively managed according to the plurality of pages. In an exemplary embodiment, each of the first through third mapping tables may be managed according to each of data types, that is, data according to a request from a host and data according to a background operation, and in another exemplary embodiment, each of the first through third mapping tables may be collectively managed according to the data according to the request from the host and the data according to the background operation. In an exemplary embodiment, each of the first through third mapping tables may be managed by the number of active memory blocks.

In an exemplary embodiment, the first through third mapping tables may be stored in an area of each memory group in the memory cell array 110. In another exemplary embodiment, the first through third mapping tables may be stored in a Meta area in the memory cell array 110. In another exemplary embodiment, the first through third mapping tables may be temporarily stored in a buffer memory (not shown) in the memory controller 200.

In an exemplary embodiment, the mapping table generator 220 may store in the first mapping table a read voltage offset and an upper POS corresponding to the read voltage offset in a one-to-one manner. In another exemplary embodiment, the mapping table generator 220 may store in the first mapping table the read voltage offset and the upper POS corresponding to the read voltage offset in an inequality manner. Likewise, the mapping table generator 220 may store in the second mapping table a read voltage offset and a lower POS corresponding to the read voltage offset in a one-to-one manner, or may store in the second mapping table the read voltage offset and the lower POS corresponding to the read voltage offset in an inequality manner. Likewise, the mapping table generator 220 may store in the third mapping table a read voltage offset and a middle POS corresponding to the read voltage offset in a one-to-one manner, or may store in the third mapping table the read voltage offset and the middle POS corresponding to the read voltage offset in an inequality manner. A detailed operation of the mapping table generator 220 will be explained below with reference to FIGS. 16 through 22.

The read voltage determiner 230 may variably determine a read voltage for performing a read operation on the memory device 100 based on the first through third mapping tables and the program order information. For example, when a read request from the host is received or a read command for the memory device 100 is generated, an operation of the read voltage determiner 230 may be initialized. In detail, the read voltage determiner 230 may search for a POS corresponding to a memory group to be read from among the plurality of memory groups based on the program order information, may search for a read voltage offset corresponding to the searched POS, and may perform a read operation on the memory group by using the searched read voltage offset.

In an exemplary embodiment, the memory groups may be divided according to memory blocks. When read operations for a first address and a second address that are included in the same memory block are sequentially performed, the read voltage determiner 230 may determine a read voltage of the first address by referring to the program order information. In contrast, the read voltage determiner 230 may determine a read voltage of the second address to be the same as the read voltage of the first address, without referring to the program order information.

In another exemplary embodiment, the memory groups may be divided according to word lines. When read operations for a first page and a second page that are connected to the same word line are sequentially performed, the read voltage determiner 230 may determine a read voltage of the first page by referring to the program order information. In contrast, the read voltage determiner 230 may determine a read voltage of the second page to be the same as the read voltage of the first page, without referring to the program order information.

FIG. 2 is a detailed block diagram illustrating the memory device 100 that is included in the memory system 10 of FIG. 1, according to an exemplary embodiment.

Referring to FIG. 2, the memory device 100 may include the memory cell array 110, a control logic 120, a voltage generator 130, a row decoder 140, and a page buffer 150. Although not shown in FIG. 2, the memory device 100 may further include an input/output circuit or an input/output interface. Elements that are included in the memory device 100 will now be explained in detail.

The memory cell array 110 may be connected to the plurality of word lines WL and the plurality of bit lines BL. Although not shown in FIG. 2, the memory cell array 110 may be connected to at least one string selection line SSL and at least one ground selection line GSL. The memory cell array 110 may include a plurality of memory cells (MC of FIG. 4 or MC1 through MC8 of FIG. 6) that are provided at intersections between the plurality of word lines WL and the plurality of bit lines BL. Each of the plurality of memory cells may store 1-bit data or multi-bit data.

When an erase voltage is applied to the memory cell array 110, the plurality of memory cells MC change to an erase state, and when a program voltage is applied to the memory cell array 110, the plurality of memory cells MC change to a program state. In this case, each of the memory cells MC may have an erase state E and at least one program state that are divided according to a threshold voltage Vth.

In an exemplary embodiment, when the memory cell MC is a single-level cell, the memory cell MC may have an erase state E and a program state P. In another exemplary embodiment, the memory cell MC may have at least one from among first through nth program states P1 through Pn, and n may be a natural number equal to or greater than 3. In an exemplary embodiment, when the memory cell MC is a multi-level cell, n is 3. In another exemplary embodiment, when the memory cell MC is a triple-level cell, n is 7.

The memory cell array 110 may include at least one selected from a single-level cell block including single-level cells, a multi-level cell block including multi-level cells, and a triple-level cell block including triple-level cells. In other words, some memory blocks from among the plurality of memory blocks that are included in the memory cell array 110 may be single-level cell blocks and other memory blocks may be multi-level cell blocks or triple-level cell blocks.

The control logic 120 may output various control signals for writing data to the memory cell array 110 or reading data from the memory cell array 110 based on the command CMD, the address ADDR, and the control signal CTRL that are received from the memory controller 200. Accordingly, the control logic 120 may generally control various operations in the memory device 100.

The various control signals that are output from the control logic 120 may be applied to the voltage generator 130, the row decoder 140, and the page buffer 150. In detail, the control logic 120 may apply a voltage control signal CTRL_vol to the voltage generator 130, a row address X_ADDR to the row decoder 140, and a column address Y_ADDR to the page buffer 150. However, the inventive concept is not limited thereto, and the control logic 120 may further apply other control signals to the voltage generator 130, the row decoder 140, and the page buffer 150.

The voltage generator 130 may generate various types of voltages for performing a program operation, a read operation, and an erase operation on the memory cell array 110 based on the voltage control signal CTRL_vol. In detail, the voltage generator 130 may generate a word line driving voltage VWL for driving the plurality of word lines WL. In this case, the word line driving voltage VWL may be a program voltage (or a write voltage), a read voltage, an erase voltage, an inhibit voltage, or a program verify voltage. Although not shown in FIG. 2, the voltage generator 130 may further generate a string selection line driving voltage VSSL for driving the plurality of string selection lines SSL and a ground selection line driving voltage VGSL for driving the plurality of ground selection lines GSL.

The row decoder 140 may be connected to the memory cell array 110 through the plurality of word lines WL, and may activate some word lines from among the plurality of word lines WL in response to the row address X_ADDR that is received from the control logic 120. In detail, during a read operation, the row decoder 140 may apply a read voltage to a selected word line and may apply an inhibit voltage to a non-selected word line. Also, during a program operation, the row decoder 140 may apply a program voltage to a selected word line and may apply an inhibit voltage to a non-selected word line.

The page buffer 150 may be connected to the memory cell array 110 through the plurality of bit lines BL. In detail, during a read operation, the page buffer 150 may output the data DATA that is stored in the memory cell array 110 by operating a sense amplifier. During a program operation, the page buffer 150 may input the data DATA to be stored to the memory cell array 110 by operating a write driver.

Figure 3:
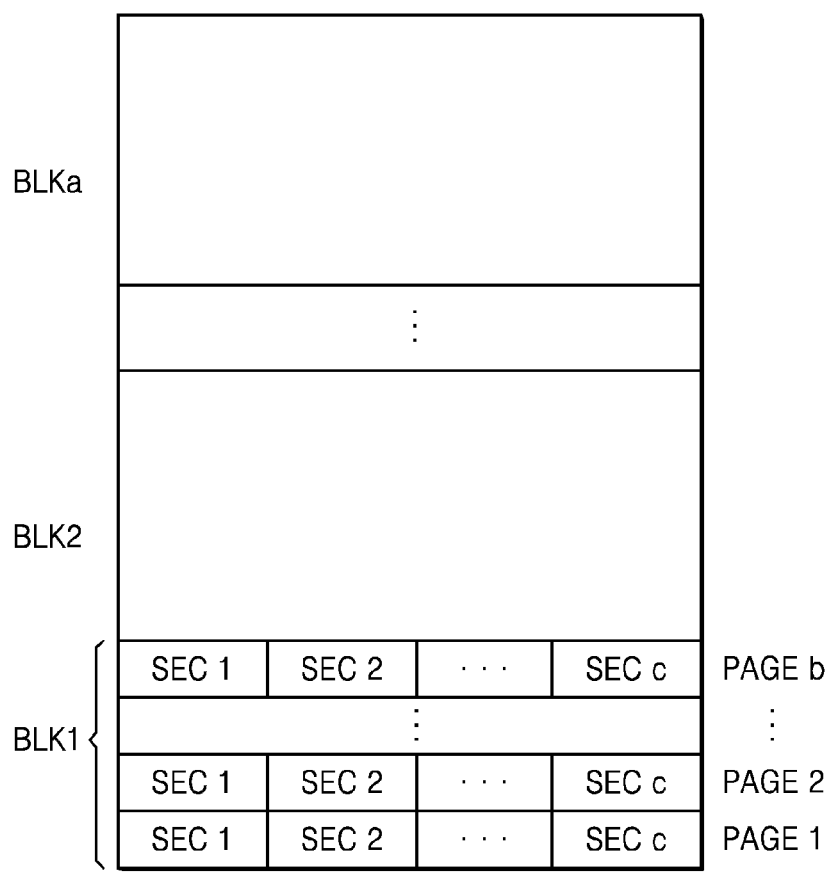
FIG. 3 is a diagram illustrating a memory cell array that is included in the memory device of FIG. 2, according to an exemplary embodiment.

FIG. 3 is a diagram illustrating the memory cell array 110 that is included in the memory device 100 of FIG. 2, according to an exemplary embodiment.

Referring to FIG. 3, the memory cell array 110 may be a flash memory cell array. In this case, the memory cell array 110 may include a (a is an integer equal to or greater than 2) memory blocks, that is, first through ath memory blocks BLK1 through BLKa, each of the first through ath memory blocks BLK1 through BLKa may include b (b is an integer equal to or greater than 2) pages PAGE1 through PAGEb, and each of the pages PAGE1 through PAGEb may include c (c is an integer equal to or greater than 2) sectors SEC1 through SECc. Although the pages PAGE1 through PAGEb and the sectors SEC1 through SECc of only the first memory block BLK1 are shown in FIG. 3 for convenience, the other memory blocks, that is, the second through ath memory blocks BLK2 through BLKa, may have the same structures as that of the first memory block BLK1.

Figure 4:
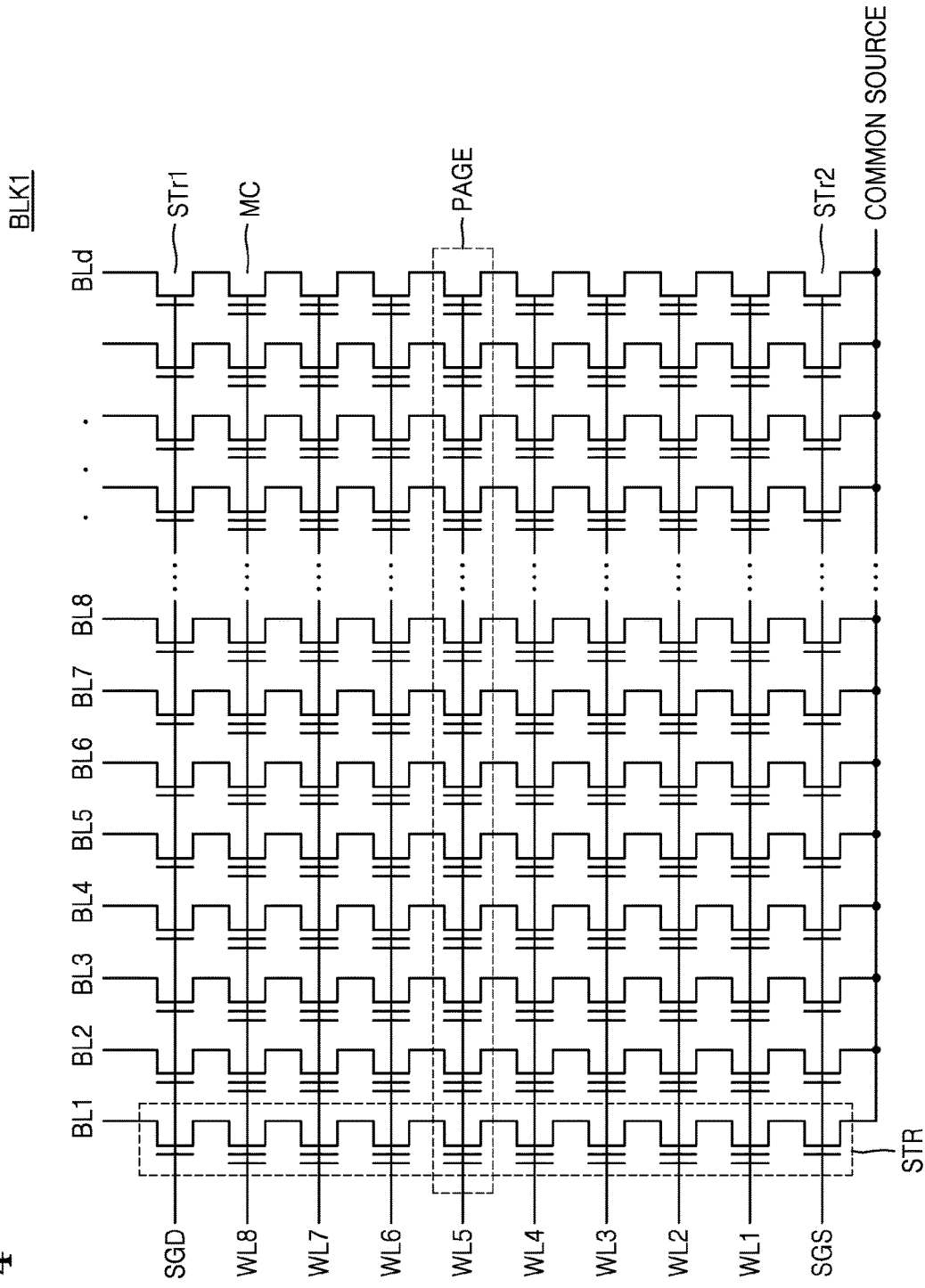
FIG. 4 is a circuit diagram illustrating a memory block that is included in the memory cell array of FIG. 3, according to an exemplary embodiment.

FIG. 4 is a circuit diagram illustrating the first memory block BLK1 that is included in the memory cell array 110 of FIG. 3, according to an exemplary embodiment.

Referring to FIG. 4, the first memory block BLK1 may be a horizontal NAND flash memory block, and each of the first through ath memory blocks BLK1 through BLKa of FIG. 3 may be formed as shown in FIG. 4. The first memory block BLK1 may include, for example, d (d is an integer equal to or greater than 2) strings STR to which 8 memory cells are serially connected. Each of the strings STR may include a drain selection transistor STr1 and a source selection transistor STr2 that are respectively connected to both ends of the memory cells MC that are serially connected. The number of the strings STR, the number of the word lines WL, and the number of the bit lines BL may be changed in various ways according to exemplary embodiments.

The NAND flash memory device of FIG. 4 may allow an erase operation to be performed in units of memory blocks and may allow a program operation to be performed in units of pages corresponding to word lines WL1 through WL8. For example, when the memory cell MC is a single-level cell, one page may correspond to each word line. Alternatively, when the memory cell MC is a multi-level cell or a triple-level cell, a plurality of pages may correspond to each word line.

Figure 5:
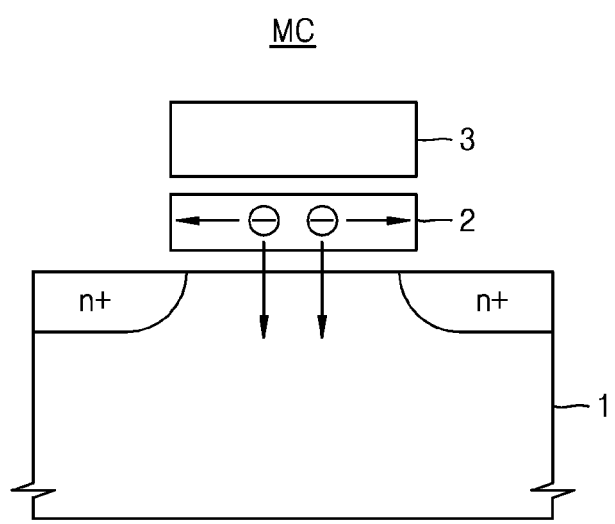
FIG. 5 is a cross-sectional view illustrating a memory cell that is included in the memory block of FIG. 4, according to an exemplary embodiment.

FIG. 5 is a cross-sectional view illustrating the memory cell MC that is included in the first memory block BLK1 of FIG. 4, according to an exemplary embodiment.

Referring to FIG. 5, the memory cell MC may include a channel region 1, a charge storage layer 2, and a control gate 3. For example, the charge storage layer 2 may include a floating gate that is a conductor, and in this case, the memory cell MC may be referred to as a floating gate structure cell. Alternatively, the charge storage layer 2 may include, for example, silicon nitride (SiN) that is a non-conductor, and in this case, the memory cell MC may be referred to as a charge trap flash (CTF) cell.

To perform a program operation on the memory cell MC, a relatively high program voltage may be applied to the control gate 3 and a relatively low voltage (for example, 0 V) may be applied to the channel region 1. Since an electric field is formed in a direction from the control gate 3 to the channel region 1 according to such a bias condition, charges, for example, electrons, may move from the channel region 1 to the charge storage layer 2, and thus the memory cell MC may be programmed.

When the memory device 100 is a flash memory device, data that is stored in the memory cell MC may be read according to the threshold voltage Vth of the memory cell MC. In this case, the threshold voltage Vth of the memory cell MC may be determined by the number of electrons that are stored in the charge storage layer 2. In detail, as the number of electrons that are stored in the charge storage layer 2 increases, the threshold voltage Vth of the memory cell MC may increase.

As a time after a program operation performed on the memory cell MC is completed increases, that is, as a retention time increases, charge loss increases. In detail, as time passes, electrons that are trapped in the charge storage layer 2 during a program operation are rearranged, for example, move to the channel region 1 (see a vertical arrow in FIG. 5) to be lost or move in the charge storage layer 2 (see a horizontal arrow in FIG. 5) to be reduced. Accordingly, the threshold voltage Vth of the memory cell MC may be reduced, and thus there may be drooping and spreading in a distribution of the threshold voltage Vth of the memory cells MC.

Figure 6:
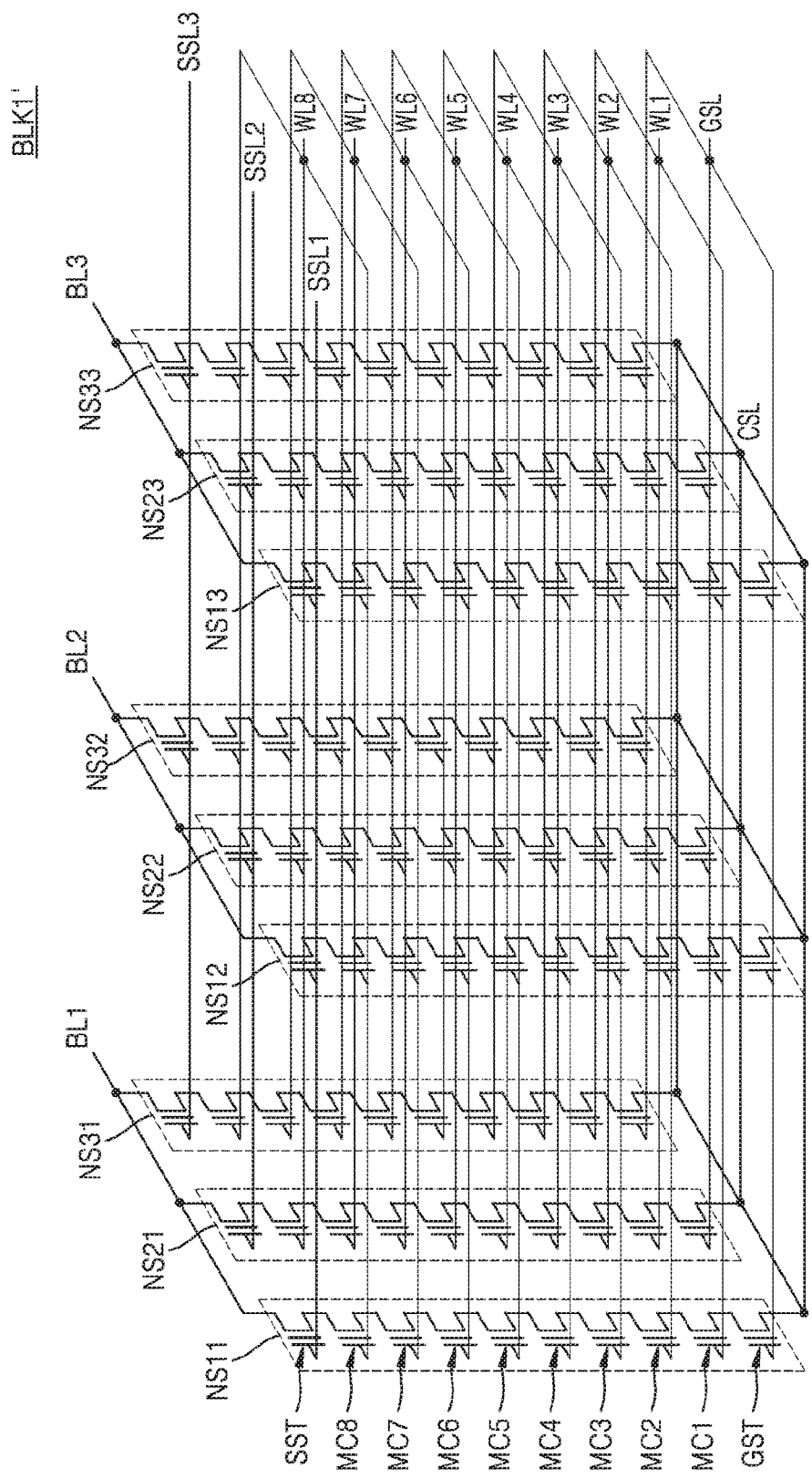
FIG. 6 is a circuit diagram illustrating a memory block that is included in the memory cell array of FIG. 3, according to another exemplary embodiment.

FIG. 6 is a circuit diagram illustrating a first memory block BLK1' that is included in the memory cell array 110 of FIG. 3, according to another exemplary embodiment.

Referring to FIG. 6, the first memory block BLK1' may be a vertical NAND flash memory block, and the first through ath memory blocks BLK1 through BLKa of FIG. 3 may be formed as shown in FIG. 6. The first memory block BLK1' may include a plurality of NAND strings NS11 through NS33, the plurality of word lines WL1 through WL8, a plurality of bit lines BL1 through BL3, the ground selection line GSL, a plurality of string selection lines SSL1 through SSL3, and a common source line CSL. The number of NAND strings, the number of word lines, the number of bit lines, the number of ground selection lines, and the number of string selection lines may be changed in various ways according to exemplary embodiments.

The NAND strings NS11 through NS33 are connected between the bit lines BL1 through BL3 and the common source line CSL. Each of the NAND strings NS11 through NS33 (for example, NS11) may include a string selection transistor SST, the plurality of memory cells MC1 through MC8, and a ground selection transistor GST that are serially connected.

The string selection transistors SST are connected to the string selection lines SSL1 through SSL3. The plurality of memory cells MC1 through MC8 are respectively connected to the word lines WL1 through WL8. The ground selection transistors GST are connected to the ground selection line GSL. The string selection transistors SST are connected to the bit line BL corresponding to the string selection transistor SST, and the ground selection transistors GST are connected to the common source line CSL.

Word lines having the same height (for example, the word lines WL1) are commonly connected, and the string selection lines SSL1 through SSL3 are separated from one another. When memory cells that are connected to the first word lines WL1 and belong to the NAND strings NS11, NS12, and NS13 are programmed, the first word line WL1 and the first string selection line SSL1 are selected.

Figure 7:
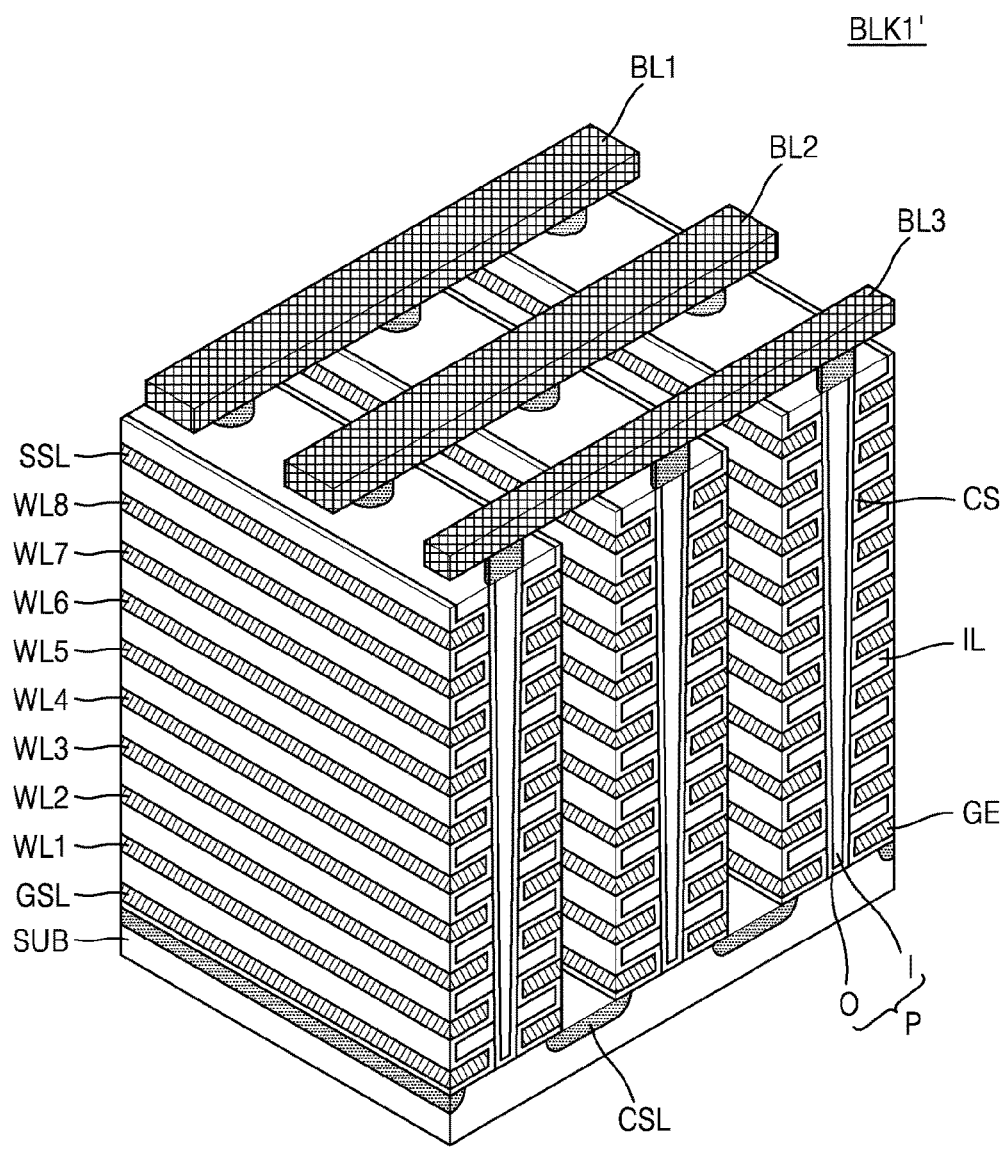
FIG. 7 is a perspective view illustrating the memory block of FIG. 6, according to an exemplary embodiment.

FIG. 7 is a perspective view illustrating the first memory block BLK1' of FIG. 6, according to an exemplary embodiment.

Referring to FIG. 7, the first memory block BLK1' is formed in a direction that is perpendicular to a substrate SUB. The common source line CSL is disposed in the substrate SUB, and gate electrodes GE and insulating layers IL are alternately stacked on the substrate SUB. Also, a charge storage layer CS may be formed between the gate electrodes GE and the insulating layers IL.

When the plurality of gate electrodes GE and the plurality of insulating layers IL that are alternately stacked are vertically patterned, a pillar P having a V-shape is formed. The pillar P passes through the gate electrodes GE and the insulating layers IL and is connected to the substrate SUB. An outer portion O of the pillar P may be formed of a semiconductor material and may function as a channel region, and an inner portion I of the pillar P may be formed of an insulating material such as silicon oxide.

The gate electrodes GE of the first memory block BLK1' may be connected to the ground selection line GSL, the plurality of word lines WL1 through WL8, and the string selection line SSL. The pillar P of the first memory block BLK1' may be connected to the plurality of bit lines BL1 through BL3. Although the first memory block BLK1' includes two selection lines GSL and SSL, eight word lines WL1 through WL8, and three bit lines BL1 through BL3 in FIG. 7, the number of the elements is not limited thereto and various modifications may be made.

Figure 8A:
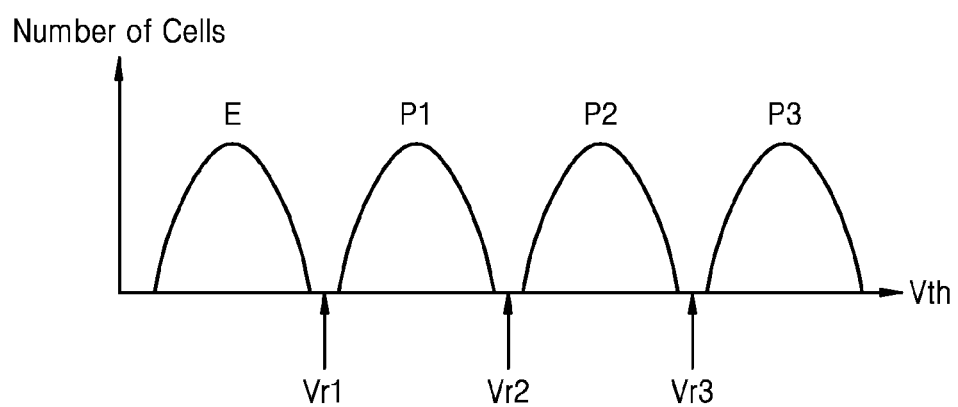
FIG. 8A is a graph illustrating distributions according to a threshold voltage after a program operation performed on the memory device is completed when the memory cell is a multi-level cell, according to an exemplary embodiment.

FIG. 8A is a graph illustrating distributions according to the threshold voltage Vth after a program operation performed on the memory device 100 is completed when the memory cell MC is a multi-level cell, according to an exemplary embodiment.

Referring to FIG. 8A, the horizontal axis represents the threshold voltage Vth and the vertical axis represents the number of memory cells MC. The memory cells MC may be the memory cells MC of FIG. 4 or 6. When each of the memory cells MC is a multi-level cell that is programmed to 2 bits, the memory cell MC may have one from among the erase state E, a first program state P1, a second program state P2, and a third program state P3. Since an interval between threshold voltage distributions in a multi-level cell is less than that in a single-level cell, a serious problem may be caused by a slight change in the threshold voltage Vth in the multi-level cell.

Each of first through third read voltages Vr1, Vr2, and Vr3 corresponds to a default level that is initially set. In detail, the first read voltage Vr1 has a voltage level between a distribution of the memory cell MC having the erase state E and a distribution of the memory cell MC having the first program state P1. The second read voltage Vr2 has a voltage level between the distribution of the memory cell MC having the first program state P1 and a distribution of the memory cell MC having the second program state P2. The third read voltage Vr3 has a voltage level between the distribution of the memory cell MC having the second program state P2 and a distribution of the memory cell MC having the third program state P3.

For example, when the first read voltage Vr1 is applied to a control gate of the memory cell MC, the memory cell MC having the erase state E is turned on and the memory cell MC having the first program state P1 is turned off. Once the memory cell MC is turned on, current flows through the memory cell MC, and once the memory cell MC is turned off, current does not flow through the memory cell MC.

Accordingly, data that is stored in the memory cell MC may be distinguished according to whether the memory cell MC is turned on or off.

In an exemplary embodiment, when the first read voltage Vr1 is applied and the memory cell MC is turned on, data '1' may be stored. When the memory cell MC is turned off, data '0' may be stored. However, the inventive concept is not limited thereto, and in another exemplary embodiment, when the first read voltage Vr1 is applied and the memory cell MC is turned on, data '0' may be stored and when the memory cell MC is turned off, data '1' may be stored. As such, allocation of a logic level of data may vary according to exemplary embodiments.

Figure 8B:
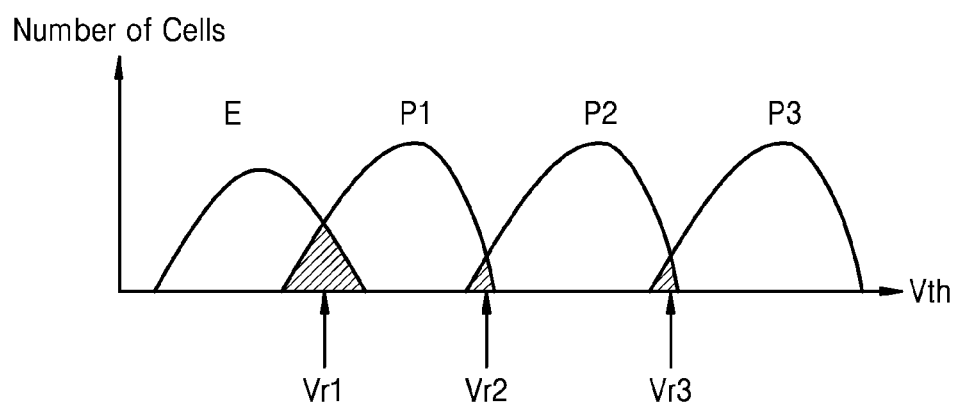
FIG. 8B is a graph illustrating distributions according to the threshold voltage a predetermined period of time after a program operation performed on the memory device having the distributions of FIG. 8A is completed, according to an exemplary embodiment.

FIG. 8B is a graph illustrating distributions according to the threshold voltage Vth a predetermined period of time after a program operation performed on the memory device 100 having the distributions of FIG. 8A is completed, according to an exemplary embodiment.

Referring to FIG. 8B, as a retention time increases, the threshold voltage Vth of the memory cells MC that are programmed to have the erase state E and the first through third program states P1 through P3 may decrease, and thus modified distributions of FIG. 8B may be obtained. A read error may occur in the memory cell MC that is in a state in the hatched area in FIG. 8B, thereby reducing the reliability of the memory device 100.

For example, when a read operation is performed on the memory device 100 by using the first read voltage Vr1, the memory cell MC that is in a state in the hatched area may be determined to have the erase state E due to a reduction in the threshold voltage Vth although the memory cell MC that is in a state in the hatched area is programmed to have the first program state P1. Accordingly, an error occurs in the read operation, thereby reducing the reliability of the memory device 100.

When data is read from the memory device 100, a raw bit error rate (RBER) may vary according to a voltage level of a read voltage, and an optimum voltage level of the read voltage may be determined according to a threshold voltage distribution shape of the memory cell MC. Accordingly, as a threshold voltage distribution of the memory cell MC changes, the optimum voltage level of the read voltage that is necessary to read the data from the memory device 100 may change. Hence, it is necessary to determine the optimum voltage level of the read voltage by changing the voltage level of the read voltage based on a change in the threshold voltage distribution. In this case, to efficiently determine the optimum voltage level of the read voltage, it is necessary to reduce power consumption and an operation time by simplifying a mathematical operation.

A case where the memory cell MC is a multi-level cell has been explained with reference to FIGS. 8A and 8B. However, the inventive concept is not limited thereto, and the memory cell MC may be a single-level cell, a triple-level cell, or a cell that is programmed to 4 bits or more. Also, the memory device 100 of FIGS. 1 and 2 may include memory cells MC that are programmed to different numbers of bits.

Figure 9:
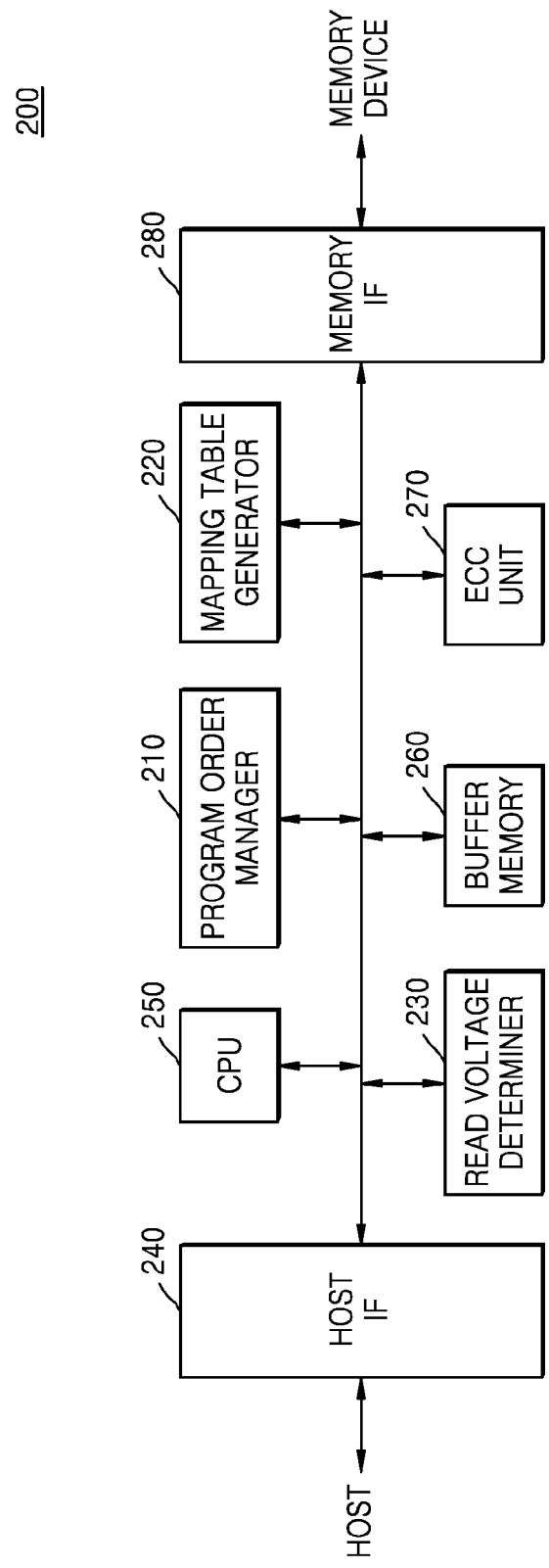
FIG. 9 is a detailed block diagram illustrating a memory controller that is included in the memory system of FIG. 1, according to an exemplary embodiment.

FIG. 9 is a detailed block diagram illustrating the memory controller 200 that is included in the memory system 10 of FIG. 1, according to an exemplary embodiment.

Referring to FIG. 9, the memory controller 200 may include the program order manager 210, the mapping table generator 220, the read voltage determiner 230, a host interface 240, a central processing unit (CPU) 250, a buffer memory 260, an error correction code (ECC) unit 270, and a memory interface 280.

The host interface 240 may receive a request of a memory operation from a host by interfacing with the host. In detail, the host interface 240 may receive various requests such as a data read request and a data write request from the host, and generates various internal signals for the memory operation of the memory device 100 in response to the various requests. For example, the memory controller 200 may be configured to communicate with the host through at least one selected from various interface protocols such as a universal serial bus (USB), multimedia card (MMC), peripheral component interconnect-express (PCI-E), advanced technology attachment (ATA), serial-ATA, parallel-ATA, small computer system interface (SCSI), enhanced small disk interface (ESDI), and integrated drive electronics (IDE).

The CPU 250 may control an overall operation of the memory controller 200. For example, the CPU 250 may control various functional blocks related to the memory operation of the memory device 100. Although the program order manager 210, the mapping table generator 220, and the read voltage determiner 230 are shown as separate blocks in the present exemplary embodiment, the program order manager 210, the mapping table generator 220, and the read voltage determiner 230 may operate as a part of the CPU 250. A detailed operation of the program order manager 210 will be explained below with reference to FIGS. 10A through 15. Also, detailed operations of the mapping table generator 220 and the read voltage determiner 230 will be explained below with reference to FIGS. 16 through 25B.

The buffer memory 260 may temporarily store data that is transmitted to the outside through the host interface 240 and data that is transmitted from the memory device 100 through the memory interface 280. Also, the buffer memory 260 may temporarily store information that is necessary to control the memory device 100. In the present exemplary embodiment, the buffer memory 260 may temporarily store program order information that is generated by the program order manager 210. Also, in the present exemplary embodiment, the buffer memory 260 may temporarily store first through third mapping tables that are generated by the mapping table generator 220. For example, although the buffer memory 260 may be a dynamic RAM (DRAM), a static RAM (SRAM), or a combination of the DRAM and the SRAM, the inventive concept is not limited thereto.

The ECC unit 270 may perform ECC encoding on write data and ECC decoding on read data by using an algorithm such as a Reed-Solomon (RS) code, a Hamming code, or a cyclic redundancy code (CRC), may generate an error detection result from data that is read from the memory device 100, and may perform error correction on the read data. For example, the ECC unit 270 may detect an error bit by comparing a parity bit that is generated and stored when data is programmed with a parity bit that is generated when data is read, and may correct the error bit by performing a predetermined logic operation (for example, exclusive OR (XOR)) on the detected error bit.

The memory interface 280 may interface with the memory device 100 to transmit and receive various signals (for example, a command, an address, and a read voltage control signal) that are generated in the memory controller 200.

FIGS. 10A through 10E are diagrams for explaining operations of managing program order information, according to exemplary embodiments.

Figure 10A:
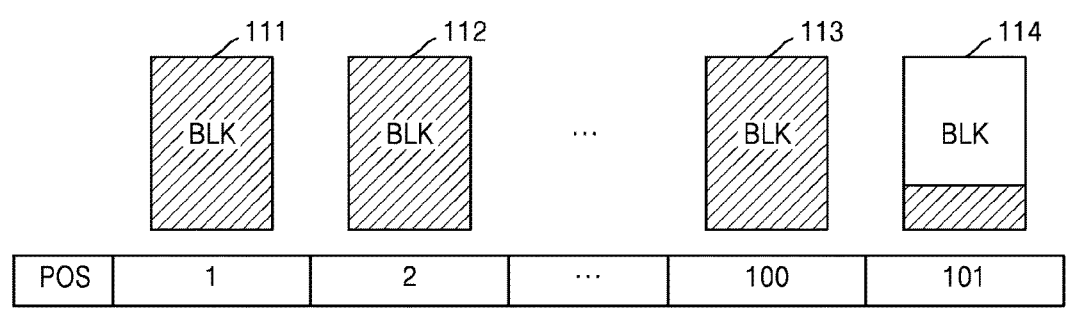
FIGS. 10A through 10E are diagrams for explaining operations of managing program order information, according to exemplary embodiments.
Figure 10B:
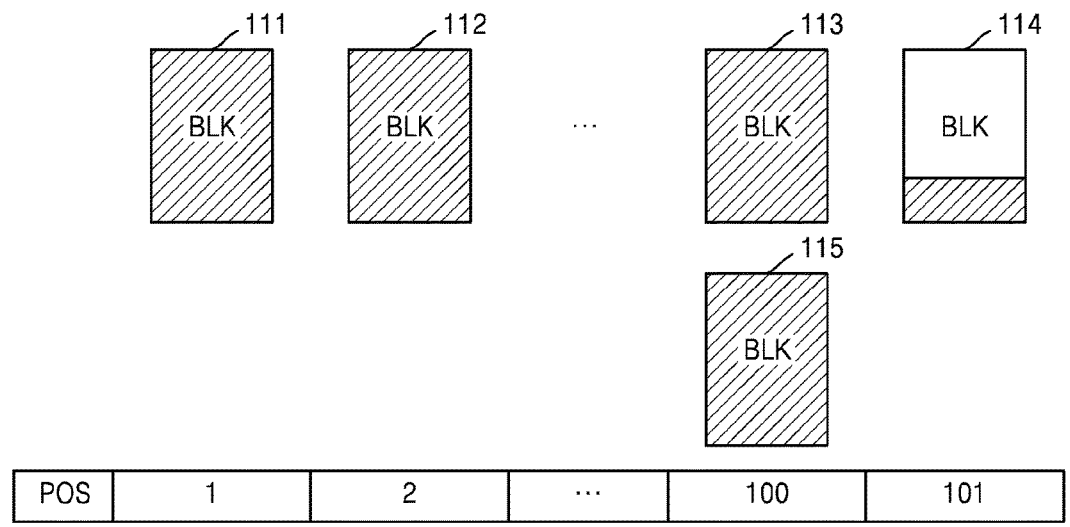
Figure 10C:
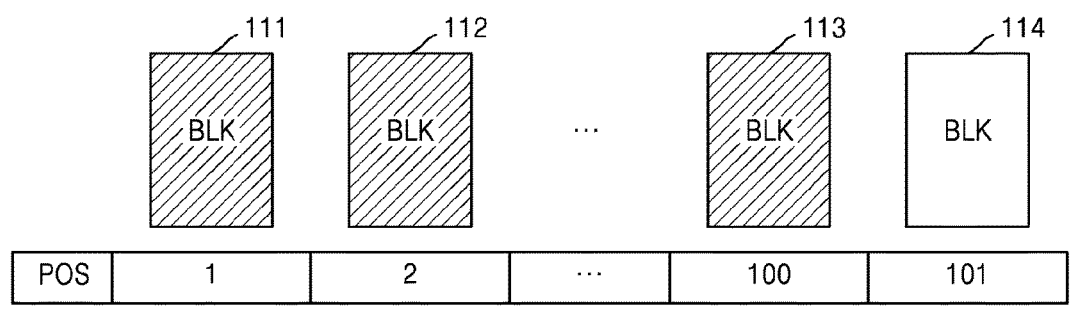
Figure 10D:
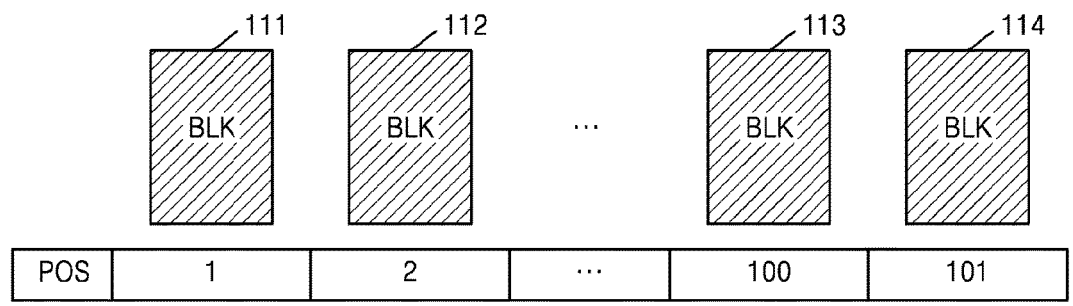
Figure 10E:
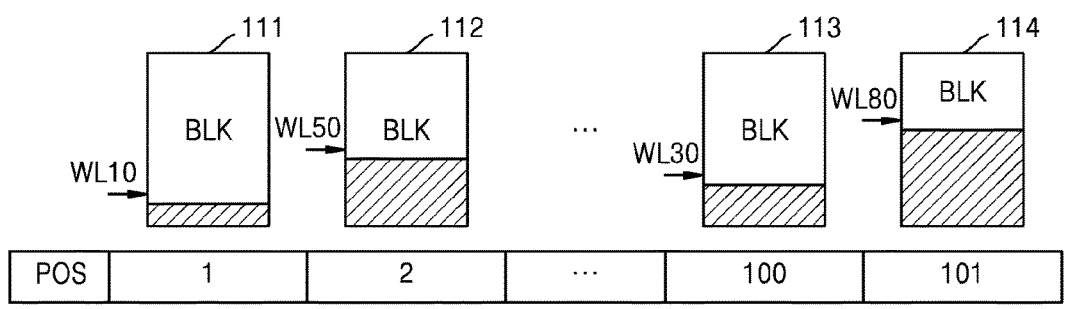

The operations of managing the program order information of FIGS. 10A through 10E may be performed by the program order manager 210 of FIG. 9. FIGS. 10A through 10D illustrate an operation of the program order manager 210 when a plurality of memory groups are divided according to memory blocks, and FIG. 10E illustrates an operation of the program order manager 210 when the plurality of memory groups are divided according to word lines.

Referring to FIG. 10A, the program order manager 210 may allocate a POS to a memory block when a program operation or an erase operation is performed on the memory block. When a program operation is firstly performed on a first memory block 111 from among a plurality of memory blocks that are included in the memory device 100, a value of a POS corresponding to the first memory block 111 may be '1'. Next, when the program operation is secondly performed on a second memory block 112, a value of a POS of the second memory block 112 is '2'. Next, when the program operation is performed for a $100^{th}$ time on a third memory block 113, a value of a POS corresponding to the third memory block 113 is '100'. Next, when the program operation is performed for a 100 time on a fourth memory block 114, a value of a POS corresponding to the fourth memory block 114 is '101'.

Referring to FIG. 10B, the program order manager 210 may allocate the same POS to a plurality of memory blocks when program operations are simultaneously or sequentially performed on the plurality of memory blocks. Also, the program order manager 210 may allocate the same POS to a plurality of memory blocks when erase operations are simultaneously or sequentially performed on the plurality of memory blocks (that is, when the plurality of memory blocks are allocated as active memory blocks).

In an exemplary embodiment, when program operations are simultaneously performed on the third memory block 113 and a fifth memory block 115, values of POSs corresponding to the third memory block 113 and the fifth memory block 115 are '100'. In another exemplary embodiment, when a time between a program operation of the third memory block 113 and a program operation of the fifth memory block 115 is less than a critical time (for example, 10 seconds), values of the POSs corresponding to the third memory block 113 and the fifth memory block 115 are '100'. As such, according to the present exemplary embodiment, the plurality of memory blocks may share one POS.

Referring to FIG. 10C, the program order manager 210 may allocate a POS to a memory block when a program operation of the memory block starts or an erase operation of the memory block starts. In an exemplary embodiment, when a program operation of the fourth memory block 114 starts, a value of a POS corresponding to the fourth memory block 114 is '101'. In another exemplary embodiment, when an erase operation of the fourth memory block 114 starts, a value of the POS corresponding to the fourth memory block 114 is '101'.

Referring to FIG. 10D, the program order manager 210 may allocate a POS to a memory block when a program operation of the memory block is completed. In the present exemplary embodiment, when a program operation of the fourth memory block 114 is completed, a value of a POS corresponding to the fourth memory block 114 is '101'.

Referring to FIG. 10E, the program order manager 210 may divide a plurality of memory blocks according to word lines and may generate program order information according to the word lines. For example, when the memory device 100 is a vertical NAND flash memory device, a program operation is performed on a plurality of word lines that are included in one memory block in an order from a word line that is disposed adjacent to the ground selection line GSL to a word line that is disposed adjacent to the string selection line SSL. Accordingly, when a POS is allocated to one word line that is included in one memory block, a program order of another word line that is adjacent to the one word line may be predicted.

In the present exemplary embodiment, the program order manager 210 may allocate a POS to a word line when a program operation or an erase operation is performed on the word line. In an exemplary embodiment, when a program operation is repeatedly performed on a word line, the program order manager 210 may allocate a POS to the word line when the program operation is firstly performed. In another exemplary embodiment, when a program operation is repeatedly performed on a word line, the program order manager 210 may allocate a POS to the word line when the program operation is lastly performed. In another exemplary embodiment, the program order manager 210 may allocate a POS to a word line when a reprogram operation is performed on the word line and a fine program operation is completed.

When a program operation is firstly performed on a word line WL10 that is included in the first memory block 111, a value of a POS corresponding to the word line WL10 is '1'. Next, when the program operation is secondly performed on a word line WL50 that is included in the second memory block 112, a value of a POS corresponding to the word line WL50 is '2'. Next, when the program operation is for the $100^{th}$ time performed on a word line WL30 that is included in the third memory block 113, a value of a POS corresponding to the word line WL30 is '100'. Next, when the program operation is for the 100 time performed on a word line WL80 that is included in the fourth memory block 114, a value of a POS corresponding to the word line WL80 is '101'.

In the present exemplary embodiment, since a plurality of memory groups are divided according to word lines and program order information is generated according to the word lines, even when a program time difference between different word lines that are included in the same block is large, the reliability of the memory device 100 may be ensured. For example, when a program operation is not performed for a long time on the memory device 100 and then the program operation is resumed, a program time difference between different word lines that are included in the same block may be large. Alternatively, when power is not supplied for a long time to the memory device 100 and power supply is resumed, a program time difference between different word lines that are included in the same block may be large.

Figure 11:
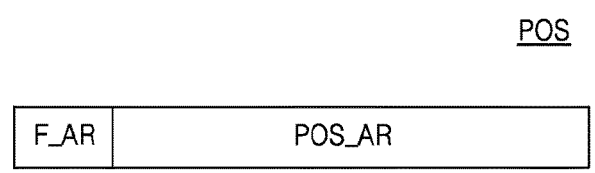
FIG. 11 is a diagram illustrating a memory area that stores a program order stamp (POS), according to an exemplary embodiment.

FIG. 11 is a diagram illustrating a memory area that stores a POS, according to an exemplary embodiment.

Referring to FIG. 11, the program order manager 210 may allocate a POS to each memory group and may store the POS in an area of the memory group. In an exemplary embodiment, when a plurality of memory groups are divided according to memory blocks, to store POSs, for example, a 4 byte (4 B) memory area may be allocated to each memory block. In the present exemplary embodiment, the memory area may include a flag area F-AR and a POS area POS_AR. For example, the flag area F_AR may be allocated to have 1 bit and the POS area POS_AR may be allocated to have 31 bits.

The flag area F_AR is an area for storing a flag indicating whether the memory block may be used to update a mapping table that stores a read voltage offset and a POS corresponding to the read voltage offset. The read voltage offset may be an offset to a read voltage that is initially set, that is, an offset to a default level, to perform a read operation on the memory device 100.

In an exemplary embodiment, the program order manager 210 may reset the flag to '0' when a new POS is allocated. Accordingly, when the flag is '0', the program order manager 210 may use the memory block to update the mapping table, and when the flag is '1', the program order manager 210 may not use the memory block to update the mapping table.

In another exemplary embodiment, when a specific memory group has greater charge loss than other memory groups corresponding to adjacent POSs due to read disturbance, the program order manager 210 may set the flag to '1'. The specific memory group may be referred to as an outlier group. As such, since the flag of the outlier group is set to '1', a read result of the outlier group may not be used to update the mapping table. A typical read retry operation may be performed on the outlier group.

The POS area POS_AR is an area for storing the POS that is allocated to the memory block. For example, when the POS area POS_AR is allocated to have 31 bits and a size of the memory block is 1 TB, the POS of the memory block may be stably stored until a program/erase cycle is repeated 12,000 times.

FIG. 12 is a table that stores program order information, according to an exemplary embodiment.

Referring to FIG. 12, the program order manager 210 may sequentially store in a program order table TABLE1 POSs according to addresses of a plurality of memory groups so that the POSs may be searched according to the addresses of the plurality of memory groups. For example, when the memory groups are divided according to memory blocks, the program order table TABLE1 may store POSs according to addresses of the memory blocks. Alternatively, when the memory groups are divided according to word lines, the program order table TABLE1 may store POSs according to addresses of the word lines.

Reference numeral '121' denotes the program order table TABLE1 when a program operation is firstly performed in the memory device 100. When an address of a memory group on which the program operation is firstly performed is '2', a value of a POS corresponding to the memory group is '1'. In this case, since the program operation is not performed on remaining memory groups, that is, (N−1) memory groups, values of POSs corresponding to the remaining memory groups are all '0'.

Reference numeral '122' denotes the program order table TABLE1 when a program operation is performed for the 30000$^{th}$ time in the memory device 100. When an address of a memory group on which the program operation is 30000thly performed is 'K', a value of a POS corresponding to the memory group is '30000'.

As described above with reference to FIGS. 10A through 10E, the program order manager 210 may allocate a POS to a first memory block when a program operation of the first memory block from among a plurality of memory blocks that are included in the memory device 100 starts, when the program operation of the first memory block is completed, or when an erase operation of the first memory block is performed. Also, the program order manager 210 may allocate a POS to a first word line when a program operation is firstly performed on the first word line from among a plurality of word lines that are included in the memory device 100 or when the program operation is lastly performed.

FIG. 13 is a table that stores program order information, according to another exemplary embodiment.

Referring to FIG. 13, the program order manager 210 may store in a program order table TABLE2 an address of a memory group corresponding to a POS according to POSs that are sequentially increased, so that addresses of a plurality of memory groups may be searched according to POSs. For example, when the memory groups are divided according to memory blocks, the program order table TABLE2 may store addresses of the memory blocks corresponding to POSs. Alternatively, when the memory groups are divided according to word lines, the program order table TABLE2 may store addresses of the word lines corresponding to POSs.

An address of a memory group when a program operation is firstly performed in the memory device 100 may be '2843', an address of a memory group when the program operation is secondly performed may be '173', and an address of a memory group when the program operation is Mthly performed may be '27'. As such, since the program order table TABLE2 stores the addresses of the memory groups corresponding to the POSs that are sequentially increased, a time taken to search for program order information to control operations of the memory groups according to a program order may be reduced.

Figures 14A, 14B:
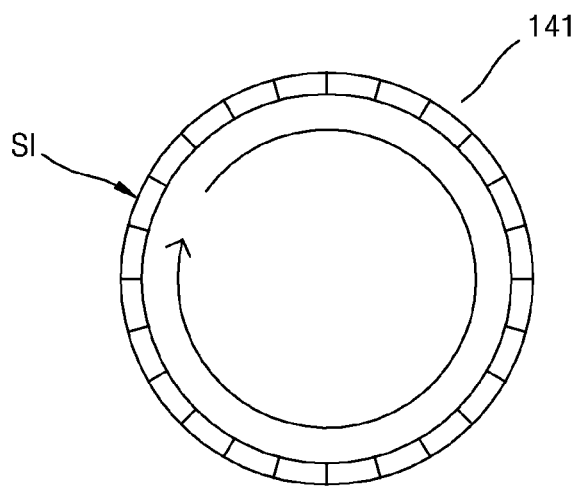
FIGS. 14A and 14B are respectively a view and a diagram illustrating a circular buffer that stores program order information, according to another exemplary embodiment.

FIGS. 14A and 14B are respectively a view and a diagram illustrating a circular buffer (or a ring buffer) 141 that stores program order information, according to another exemplary embodiment.

Referring to FIG. 14A, the program order manager 210 may store program order information by using the circular buffer 141. However, the inventive concept is not limited thereto, and in another exemplary embodiment, the program order manager 210 may store program order information by using an arbitrary first-in first-out (FIFO) buffer.

The circular buffer 141 is a data structure that uses a buffer having a fixed size as if both ends of the buffer are connected to each other. Data may be input to a continuous space that is included in the circular buffer 141 and data may be output in an order in which the data is input. A position of data that is firstly input to the circular buffer 141 may be indicated with a start index SI.

Referring to FIG. 14B, addresses may be stored in the continuous space that is included in the circular buffer 141. In this case, the same address may be stored to correspond to different indices. For example, an address '10' may be stored to correspond to an index '0' and an index '5'. In the present exemplary embodiment, a last or latest index may be determined by using the start index SI that indicates, for example, '3'.

Figure 15:
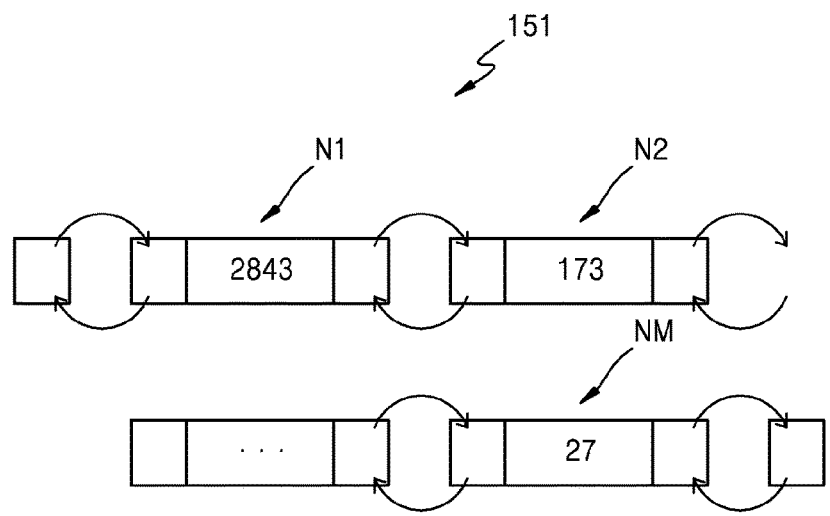
FIG. 15 is a diagram illustrating a doubly-linked list that stores program order information, according to another exemplary embodiment.

FIG. 15 is a diagram illustrating a doubly-linked list 151 that stores program order information, according to another exemplary embodiment.

Referring to FIG. 15, the program order manager 210 may store program order information by using the doubly-linked list 151. However, the inventive concept is not limited thereto, and in another exemplary embodiment, the program order manager 210 may store program order information by using a singly-linked list.

The doubly-linked list 151 is configured to include two pointers indicating a previous node and a next node and data of each node, and thus each node is accessible in either direction. An address corresponding to a POS having a value of '1' and an address corresponding to a latest POS having a value of 'M' may be easily searched for by using the doubly-linked list 151.

In the present exemplary embodiment, the program order manager 210 may store an address of a memory group in a data area of each node of the doubly-linked list 151. For example, a first node N1 may store an address '2843' corresponding to a POS having a value of '1', a second node N2 may store an address '173' corresponding to a POS having a value of '2', and an Mth node NM may store an address '27' corresponding to a POS having a value of 'M'.

As described above with reference to FIGS. 12 through 15, the program order manager 210 may store program order information by using at least one selected from a table, a linked list, a doubly-linked list, a circular buffer, and a FIFO buffer. However, the inventive concept is not limited thereto, and the program order manager 210 may store program order information by using other methods.

For example, when the memory device 100 includes at least two selected from a single-level cell block, a multi-level cell block, and a triple-level cell block, the program order manager 210 may manage program order information of only at least one selected from the multi-level cell block and the triple-level cell block. In detail, the program order manager 210 may not manage a program order of the single-level cell block and may manage a program order of only the multi-level cell block or the triple level-cell block, and may store program order information by using a table, a linked list, a doubly-linked list, a circular buffer, and a FIFO buffer.

In another exemplary embodiment, when the memory device 100 includes a multi-level cell block and a triple level-cell block, the program order manager 210 may store first program order information of the multi-level cell block and may store second program order information of the triple-level cell block. In this case, the first and second program order information may be stored by using a table, a linked list, a doubly-linked list, a circular buffer, and a FIFO buffer.

Figure 16:
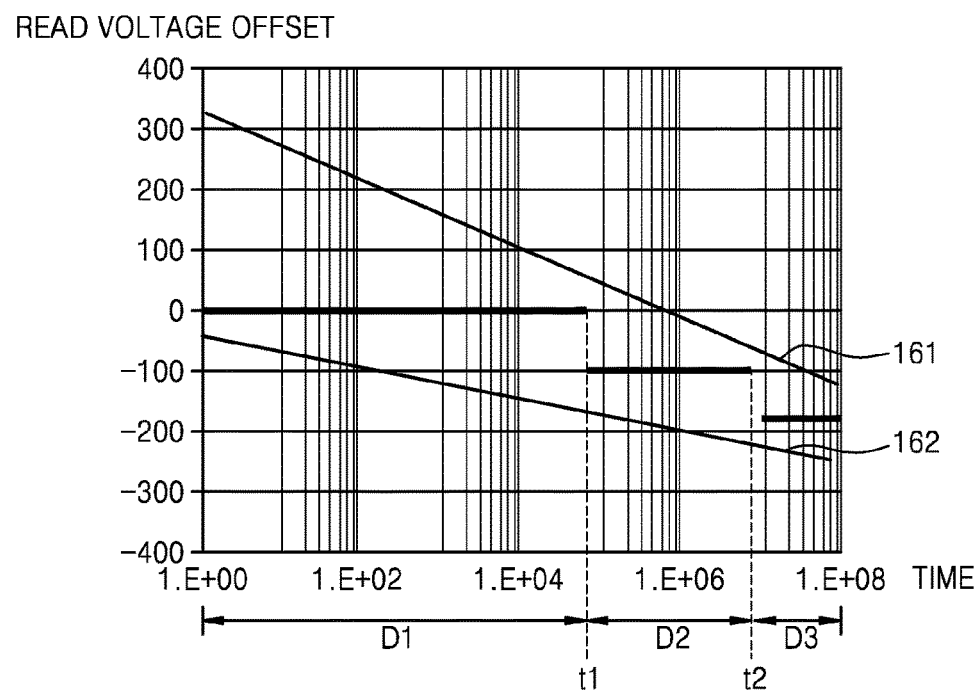
FIG. 16 is a graph illustrating a change in a read window according to time, according to an exemplary embodiment.

FIG. 16 is a graph illustrating a change in a read window according to time, according to an exemplary embodiment.

Referring to FIG. 16, the horizontal axis represents time (laid out according to a log scale), in detail, a time after a program operation is completed. The vertical axis represents a read voltage offset (mV). The read window refers to a read voltage range in which a read operation of the memory device 100 may succeed. Hence, when a read operation is performed by using a voltage level that is in the read window, the read operation may succeed whereas when a read operation is performed by using a voltage level that is outside the read window, the read operation may fail.

Reference numeral '161' denotes an upper bound level of the read window according to a time, specifically, a highest level of the read voltage range according to a time. Reference numeral '162' denotes a lower bound level of the read window according to a time, specifically, a lowest level of the read voltage range according to a time. Accordingly, when a read operation is performed by using a read voltage offset between the upper bound level '161' and the lower bound level '162', the read operation may succeed whereas when a read operation is performed by using a read voltage offset that is greater than the upper bound level '161' or less than the lower bound level '162', the read operation may fail.

Assuming that a time after a program operation is completed is not relatively long, a read operation may succeed when the read operation is performed by using a default level at which the read voltage offset is 0. In FIG. 16, the default level may be used to perform a read operation in a first duration D1 that is a period from a time 0 to a first time t1.

Assuming that a time after a program operation is completed is relatively long, a read operation may fail when the read operation is performed by using the default level whereas the read operation may succeed when the read operation is performed by using a predetermined read voltage offset. In FIG. 16, a first offset may be used to perform a read operation in a second duration D2 that is a period from the first time t1 to a second time t2, and the first offset may be, for example, −100 mV. Furthermore, in FIG. 16, a second offset may be used to perform a read operation in a third duration D3 that is a period equal to or greater than the second time t2, and the second offset may be, for example, −180 mV.

As described above, it is necessary to change a read voltage according to a time, that is, a retention time, after a program operation is completed. In a related art, a read operation is firstly performed by using a default level irrespective of a retention time. When a read failure occurs when the default level is used, a read retry operation is performed by sequentially increasing a magnitude of a read voltage offset.

Figure 17:
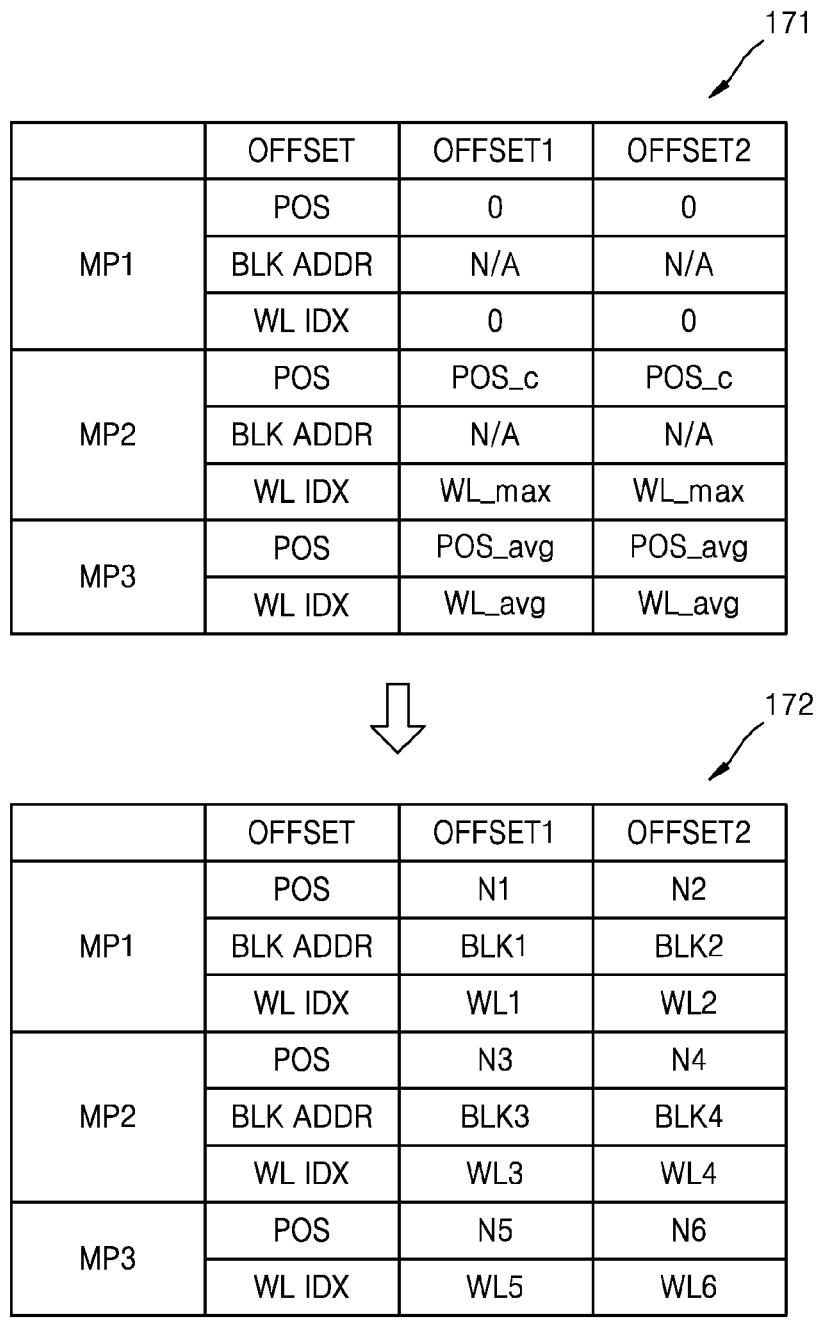
FIG. 17 is an initial mapping table and an updated mapping table, according to an exemplary embodiment.

FIG. 17 is an initial mapping table 171 and an updated mapping table 172, according to an exemplary embodiment.

Referring to FIG. 17, the initial mapping table 171 includes first through third mapping tables MP1, MP2, and MP3 before an operation of the mapping table generator 220 is performed. The first through third mapping tables MP1, MP2, and MP3 may respectively store upper, lower, and middle POSs corresponding to first and second offsets OFFSET1 and OFFSET2. For example, the first offset OFFSET1 may be −40 mV and the second offset OFFSET2 may be −80 mV. However, the inventive concept is not limited thereto and a magnitude of each offset may be changed in various ways.

In an exemplary embodiment, the first and second offsets OFFSET1 and OFFSET2 may have fixed values irrespective of the memory device 100. In detail, the first and second offsets OFFSET1 and OFFSET2 may be hard-coded by firmware, and may have fixed values irrespective of a type, a capacity, and a retention condition of the memory device 100. In another exemplary embodiment, the first and second offsets OFFSET1 and OFFSET2 may have values that vary according to the memory device 100. In detail, the first and second offsets OFFSET1 and OFFSET2 may be stored in a NAND parameter block, and may have values that vary according to a type, a capacity, and a retention condition of the memory device.

In the first mapping table MP1, upper POSs corresponding to the first and second offsets OFFSET1 and OFFSET2 are stored as '0'. In the second mapping table MP2, lower POSs corresponding to the first and second offsets OFFSET1 and OFFSET2 are each stored as a current POS POS_c and a word line index WL IDX is stored as a word line maximum value WL_max, for example, an index (for example, 128) of a word line that is disposed closest to a bit line in a memory block. In the third mapping table MP3, middle POSs corresponding to the first and second offsets OFFSET1 and OFFSET2 are each stored as an average POS POS_avg and the word line index WL IDX is stored as a word line average value WL_avg.

The updated mapping table 172 includes the first through third mapping tables MP1, MP2, and MP3 after a generate operation or an update operation of the mapping table generator 220 is performed. When the first and second mapping tables MP1 and MP2 are generated or updated, the mapping table generator 220 may accordingly generate or update the third mapping table MP3.

In the first mapping table MP1, upper POSs corresponding to the first and second offsets OFFSET1 and OFFSET2 may be respectively stored as N1 and N2. In an exemplary embodiment, block addresses BLK1 and BLK2 respectively corresponding to the upper POSs N1 and N2 may be stored in the first mapping table MP1, and in another exemplary embodiment, word line indices WL1 and WL2 respectively corresponding to the upper POSs N1 and N2 may be further stored in the first mapping table MP1. In this case, the mapping table generator 220 may generate or update the first mapping table MP1 so that the upper POS N1 is always equal to or greater than the upper POS N2.

In the second mapping table MP2, lower POSs corresponding to the first and second offsets OFFSET1 and OFFSET2 may be respectively stored as N3 and N4. In an exemplary embodiment, block addresses BLK3 and BLK4 respectively corresponding to the lower POSs N3 and N4 may be stored in the second mapping table MP2, and in another exemplary embodiment, word line indices WL3 and WL4 respectively corresponding to the lower POSs N3 and N4 may be further stored in the second mapping table MP2. In this case, the mapping table generator 220 may generate or update the second mapping table MP2 so that the lower POS N3 is always equal to or greater than the lower POS N4.

In the third mapping table MP3, middle POSs corresponding to the first and second offsets OFFSET1 and OFFSET2 may be respectively stored as N5 and N6. In an exemplary embodiment, block addresses BLK5 and BLK6 (not shown in FIG. 17) respectively corresponding to the middle POSs N5 and N6 may be stored in the third mapping table MP3, and in another exemplary embodiment, word line indices WL5 and WL6 respectively corresponding to the middle POSs N5 and N6 may be further stored in the third mapping table MP3. In this case, the mapping table generator 220 may generate or update the third mapping table MP3 so that the middle POS N5 is always equal to or greater than the middle POS N6.

Although only two offsets and POSs corresponding to the two offsets are shown in FIG. 17, the inventive concept is not limited thereto. In another exemplary embodiment, a mapping table may store one offset and a POS corresponding to the one offset. In another exemplary embodiment, a mapping table may store three or more offsets and POSs corresponding to the three or more offsets.

Figure 18:
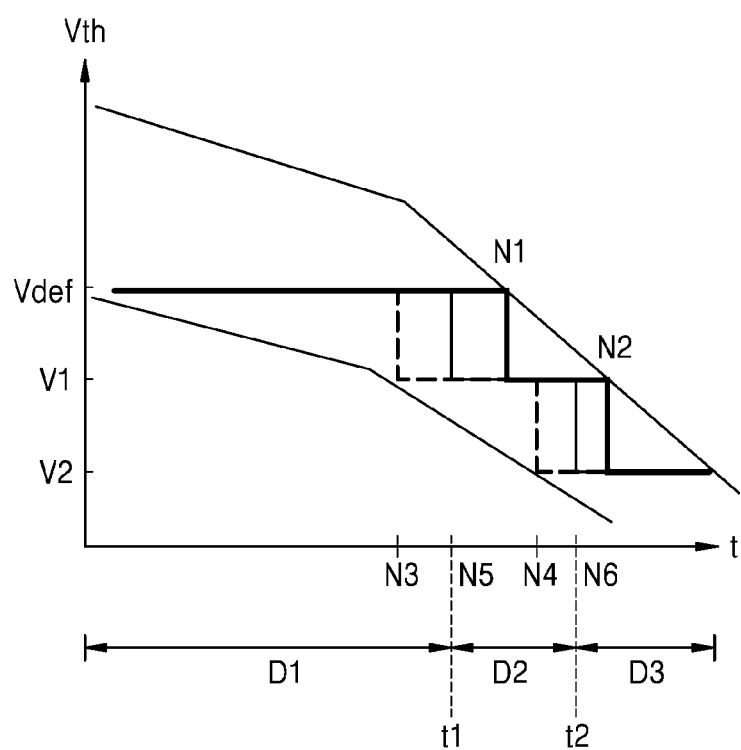
FIG. 18 is a graph illustrating a read level according to a time, according to an exemplary embodiment.

FIG. 18 is a graph illustrating a read level according to time, according to an exemplary embodiment.

Referring to FIG. 18, the horizontal axis represents time and the vertical axis represents the threshold voltage Vth. In detail, the horizontal axis represents a time, that is, a retention time, after a program operation is completed. A value of a POS may decrease as the retention time increases. FIG. 18 shows the upper, lower, and middle POSs N1 through N6 that are generated by a mapping table generating operation and are stored in the first through third mapping tables MP1 through MP3 of FIG. 17.

Referring to FIGS. 9, 17, and 18, the read voltage determiner 230 may determine a read voltage based on the middle POSs N5 and N6 by referring to the third mapping table MP3. When a read-out fails after a read operation is performed by using the read voltage that is determined by referring to the third mapping table MP3, the mapping table generator 220 may update the first mapping table MP1 and the second mapping table MP2. When a read-out succeeds after a read operation is performed by using the read voltage that is determined by referring to the third mapping table MP3, the read operation ends.

In detail, the read voltage determiner 230 may determine the default level Vdef as a read level in the first duration D1. The first duration D1 is a period from the time 0 to the first time t1, and the first time t1 may be determined based on the middle POS N5. Accordingly, in a memory group where a value of a POS is greater than that of the middle POS N5, a read operation may be performed by using the default level Vdef.

Also, the read voltage determiner 230 may determine a first level V1 to which a first offset, for example, −40 mV, to the default level Vdef is applied as a read level in the second duration D2. The second duration D2 is a period from the first time t1 to the second time t2, and the second time t2 may be determined based on the middle POS N6. Accordingly, in a memory group where a value of a POS is greater than that of the middle POS N6 and is less than that of the middle POS N5, a read operation may be performed by using the first level V1.

Also, the read voltage determiner 230 may determine a second level V2 to which a second offset, for example, −80 mV, to the default level Vdef is applied as a read level in the third duration D3. The third duration D3 is a period that is equal to or greater than the second time t2. Accordingly, in a memory group where a value of a POS is equal to or less than that of the middle POS N6, a read operation may be performed by using the second level V2.

Figure 19:
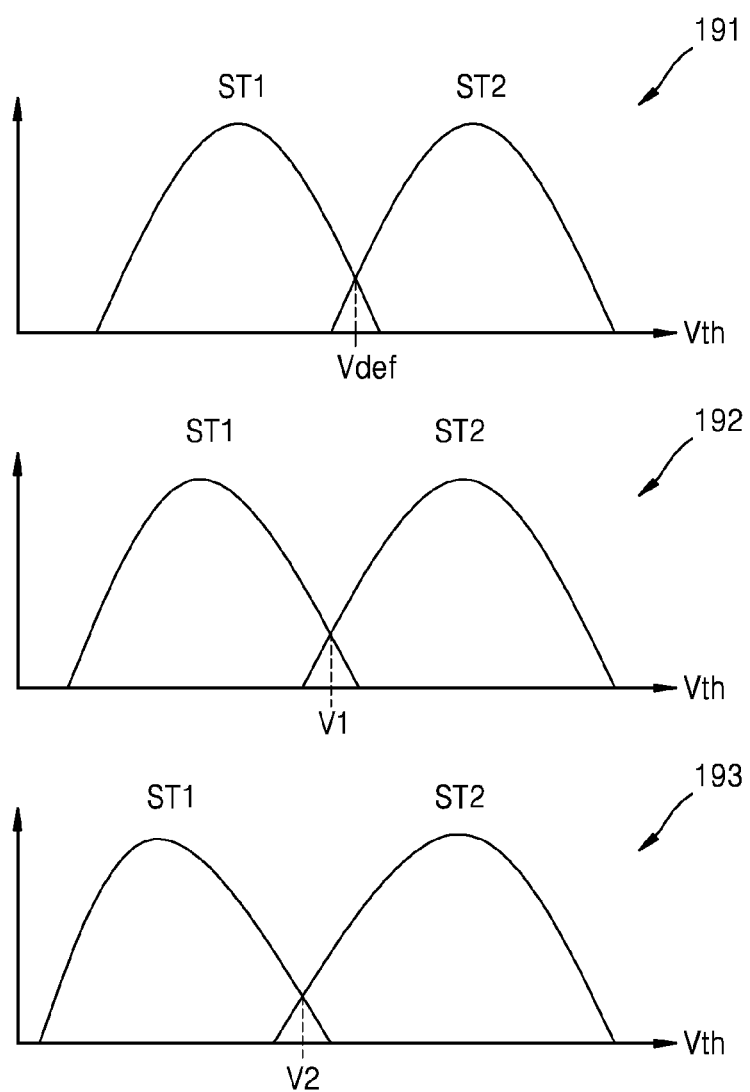
FIG. 19 is a graph illustrating some of distributions according to the threshold voltage of the memory device, according to an exemplary embodiment.

FIG. 19 is a graph illustrating some of distributions according to the threshold voltage Vth of the memory device 100, according to an exemplary embodiment.

Referring to FIG. 19, an initial distribution 191, a first variation distribution 192, and a second variation distribution 193 are threshold voltage distributions of memory cells that are programmed to have first and second states ST1 and ST2. The initial distribution 191 is a distribution right after a program operation of the memory cells is completed, the first variation distribution 192 is a distribution the first time t1 after the program operation of the memory cells is completed, and the second variation distribution 193 is a distribution the second time t2 after the program operation of the memory cells is completed. The first and second times t1 and t2 respectively correspond to the first and second times t1 and t2 of FIG. 18.

In the memory cells that are programmed to have the first and second states ST1 and ST2, the threshold voltage Vth decreases due to charge loss as a retention time increases. Accordingly, as time passes, the initial distribution 191 is changed to the first variation distribution 192, and as time passes, the first variation distribution 192 is changed to the second variation distribution 193. Accordingly, to improve the reliability of the memory device 100, it is necessary to change a read voltage according to a retention time.

Referring to FIGS. 9, 18, and 19, the read voltage determiner 230 may initially set a read voltage to the default level Vdef to perform a read operation on the memory cells that are programmed to have the first and second states ST1 and ST2. The default level Vdef may be a voltage level corresponding to a valley between the first and second states ST1 and ST2.

Also, the read voltage determiner 230 may determine a read voltage of the memory cells the first time t1 after the program operation is completed as the first level V1, based on the third mapping table MP3 and a POS. The first level V1 may be a voltage level corresponding to a valley between the first and second states ST1 and ST2 in the first variation distribution 192.

Also, the read voltage determiner 230 may determine a read voltage of the memory cells the second time t2 after the program operation is completed as the second level V2, based on the third mapping table and the POS. The second level V2 may be a voltage level corresponding to a valley between the first and second states ST1 and ST2 in the second variation distribution 193.

FIGS. 20A through 22B are diagrams for sequentially explaining an operation of generating a first mapping table, according to an exemplary embodiment.

Figures 20A, 20B:
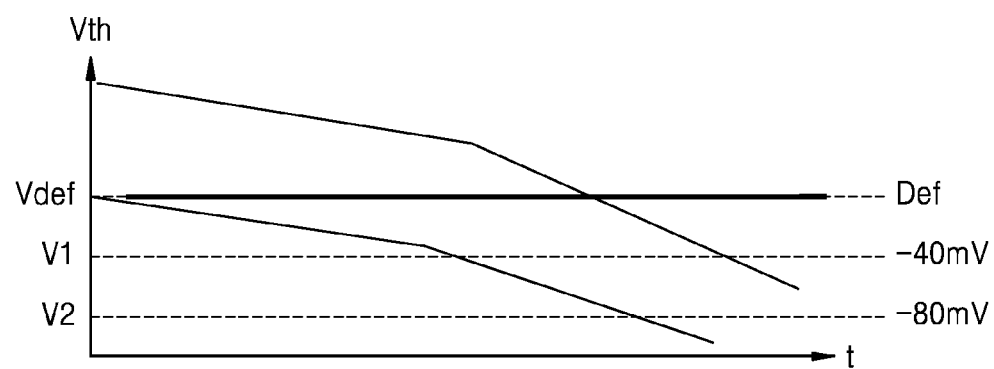
Figures 21A, 21B:
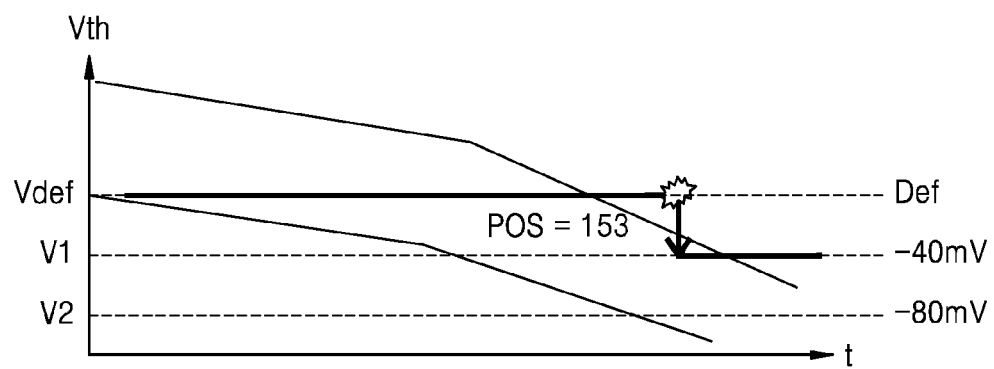
Figures 22A, 22B:
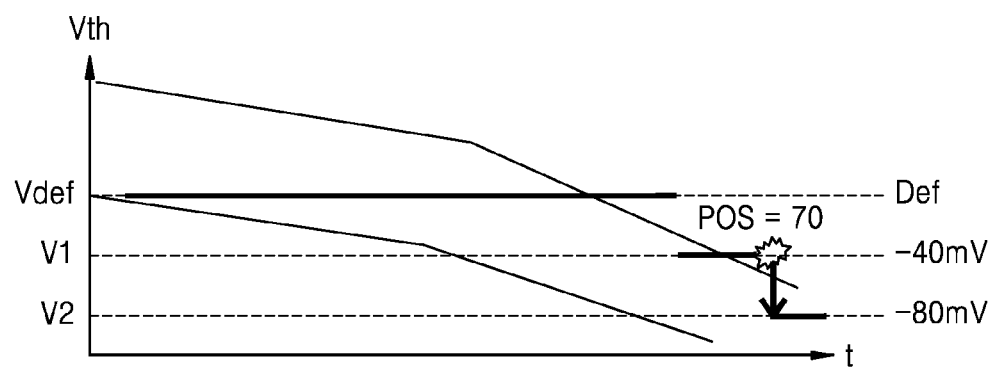

FIGS. 20A, 21A, and 22A are graphs illustrating a read level according to time, and the horizontal axis represents time and the vertical axis represents the threshold voltage Vth. FIGS. 20B, 21B, and 22B are diagrams illustrating first mapping tables respectively corresponding to FIGS. 20A, 21A, and 22A. A detailed operation of the mapping table generator 220 will now be explained in detail with reference to FIGS. 9 and 20A through 22B.

Referring to FIGS. 20A and 20B, the read voltage determiner 230 may determine the default level Vdef that is initially set as a read voltage before a mapping table is generated. Accordingly, in an initial mapping table 201, values of upper POSs corresponding to first and second offsets may be 0. For example, the first and second offsets may be respectively −40 mV and −80 mV.

Referring to FIGS. 21A and 21B, when a read-out fails after a read operation is performed at the default level Vdef on a first memory group, the read voltage determiner 230 may determine the first level V1 that is reduced by the first offset (for example, −40 mV) from the default level Vdef as a read voltage of the first memory group. When a read-out succeeds after a read operation is performed at the first level V1 on the first memory group, the mapping table generator 220 may search for a POS corresponding to the first memory group. Next, the mapping table generator 220 may determine the searched POS as the upper POS N1 (hereinafter, referred to as first upper POS N1) corresponding to the first offset, and may store the first upper POS N1 in a mapping table 211 so that the first upper POS N1 corresponds to the first offset. For example, the first upper POS N1 may be 153.

The read voltage determiner 230 may search for a POS corresponding to a second memory group, and may compare the searched POS with the first upper POS N1. When the searched POS is greater than the first upper POS N1, the read voltage determiner 230 may determine a read voltage of the second memory group as the default level Vdef. When the searched POS is equal to or less than the first upper POS N1, the read voltage determiner 230 may determine a read voltage of the second memory group as the first level V1.

Referring to FIGS. 22A and 22B, when a read-out fails after a read operation is performed at the first level V1 on the second memory group, the read voltage determiner 230 may determine the second level V2 that is reduced by the second offset from the default level Vdef as a read voltage of the second memory group. When a read-out succeeds after a read operation is performed at the second level V2 on the second memory group, the mapping table generator 220 may determine a POS corresponding to the second memory group as the upper POS N2 (hereinafter, referred to as second upper POS N2) corresponding to the second offset, and may store the second upper POS N2 in a mapping table 221 so that the second upper POS N2 corresponds to the second offset. For example, the second upper POS N2 may be 70.

As described above, according to the present exemplary embodiment, the first and second upper POSs N1 and N2 may be determined and the first mapping table may be generated by performing a read operation in an order of the default level Vdef, the first level V1, and the second level V2 on the first memory group. In other words, the mapping table generator 210 may generate the first mapping table by performing a read operation in an order from a high voltage to a low voltage. Accordingly, the first and second upper POSs N1 and N2 may be determined to be close to an upper bound level of a read voltage range.

FIGS. 23A through 25B are diagrams for sequentially explaining an operation of generating a second mapping table, according to an exemplary embodiment.

Figures 23A, 23B:
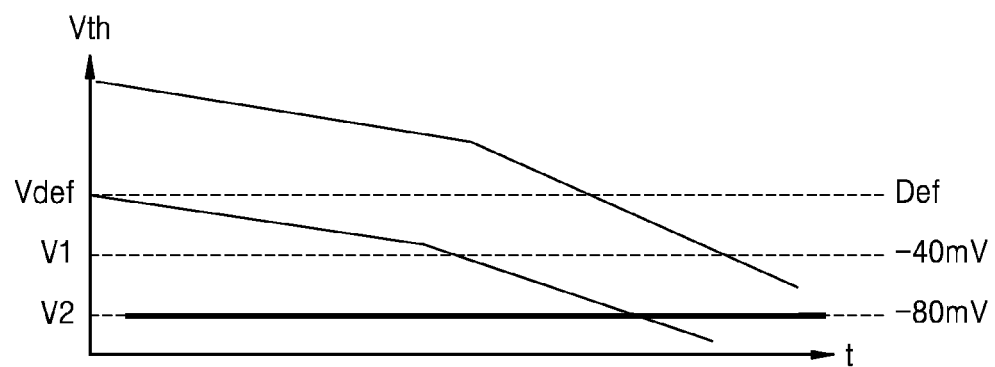
Figures 24A, 24B:
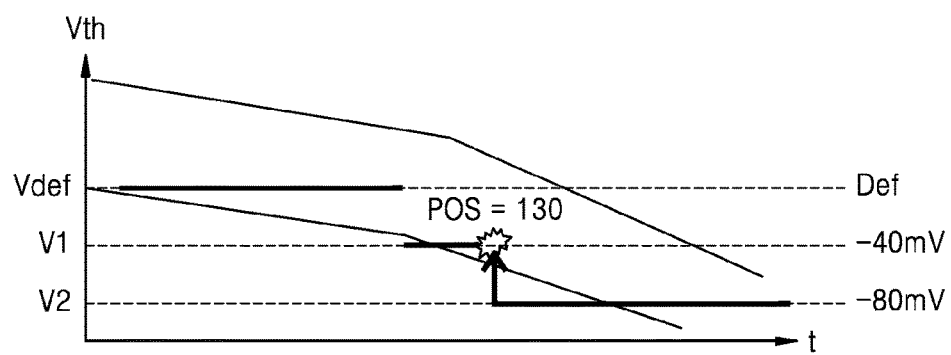
Figures 25A, 25B:
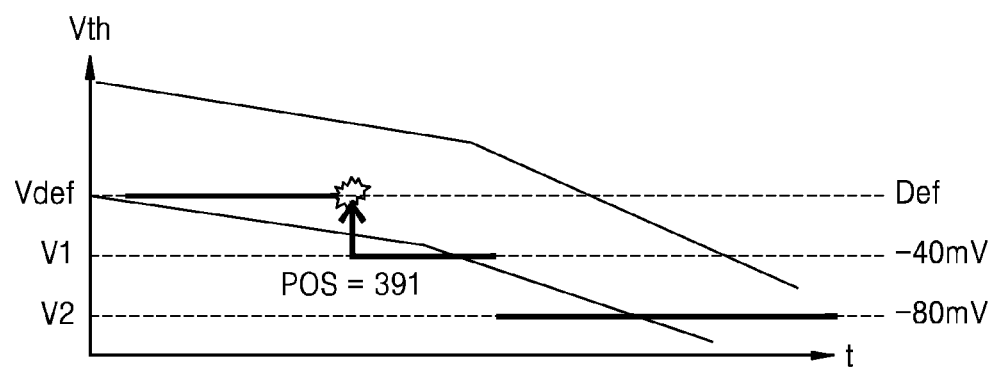

FIGS. 23A, 24A, and 25A are graphs illustrating a read level according to time, and the horizontal axis represents a time and the vertical axis represents the threshold voltage Vth. FIGS. 23B, 24B, and 25B are second mapping tables respectively corresponding to FIGS. 24A and 25A. A detailed operation of the mapping table generator 220 will now be explained with reference to FIGS. 9 and 23A through 25B.

Referring to FIGS. 23A and 23B, the read voltage determiner 230 may determine the second level V2 that is reduced by the second offset from the default level Vdef that is initially set as a read voltage before the second mapping table is generated. Accordingly, in an initial mapping table 231, values of POSs corresponding to the first and second offsets may be 0. For example, the first and second offsets may be respectively −40 mV and −80 mV.

Referring to FIGS. 24A and 24B, when a read-out fails after a read operation is performed at the second level V2 on the first memory group, the read voltage determiner 230 may determine the first level V1 that is reduced by the first offset from the default level as a read voltage of the first memory group. When a read-out succeeds after a read operation is performed at the first level V1 on the first memory group, the mapping table generator 220 may search for a POS corresponding to the first memory group. Next, the mapping table generator 220 may determine the searched POS as the lower POS N4 (hereinafter, referred to as second lower POS N4) corresponding to the second offset, and may store the second lower POS N4 in a mapping table 241 so that the second lower POS N4 corresponds to the second offset.

The read voltage determiner 230 may search for a POS corresponding to the second memory group, and may compare the searched POS with the second lower POS N4. When the searched POS is greater than the second lower POS N4, the read voltage determiner 230 may determine a read voltage of the second memory group as the first level V1. When the searched POS is equal to or less than the second lower POS N4, the read voltage determiner 230 may determine a read voltage of the second memory group as the second level V2.

Referring to FIGS. 25A and 25B, when a read-out fails after a read operation is performed at the first level V1 on the second memory group, the read voltage determiner 230 may determine the default level Vdef as a read voltage of the second memory group. When a read-out succeeds after a read operation is performed at the default level Vdef on the second memory group, the mapping table generator 220 may determine a POS corresponding to the second memory group as the lower POS N3 (hereinafter, referred to as first lower POS N3) corresponding to the first offset, and may store the first lower POS N3 in a mapping table 251 so that the first lower POS N3 corresponds to the first offset. For example, the first lower POS N3 may be 391.

As described above, according to the present exemplary embodiment, the first and second lower POSs N3 and N4 may be determined and the second mapping table may be generated by performing a read operation in an order of the second level V2, the first level V1, and the default level Vdef on the first memory group. In other words, the mapping table generator 210 may generate the second mapping table by performing a read operation in an order from a low voltage to a high voltage. Accordingly, the first and second lower POSs N3 and N4 may be determined to be close to an upper bound level of a read voltage range.

Figure 26:
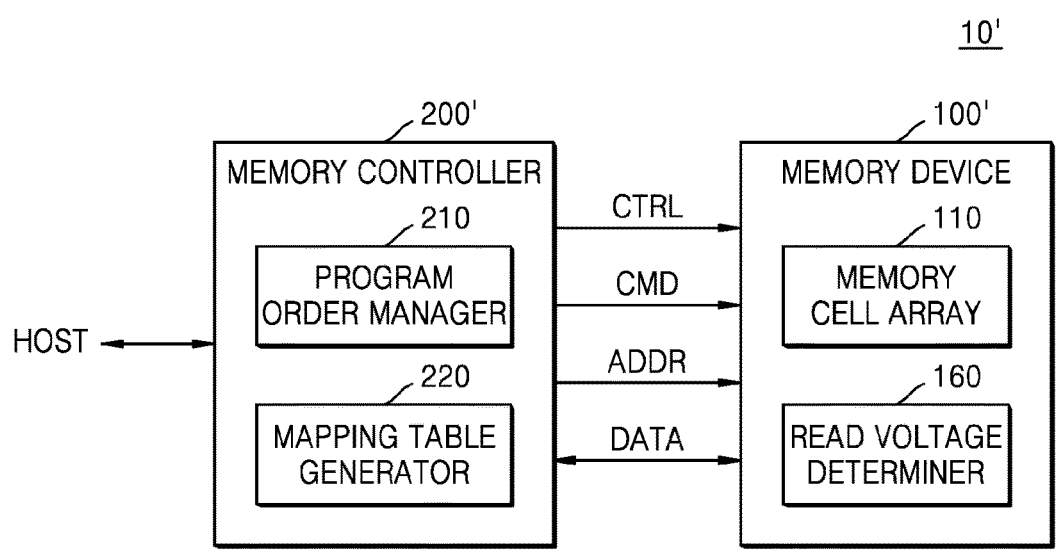
FIG. 26 is a block diagram illustrating a memory system according to another exemplary embodiment.

FIG. 26 is a block diagram illustrating a memory system 10' according to another exemplary embodiment.

Referring to FIG. 26, the memory system 10' may include a memory device 100' and a memory controller 200'. The memory controller 100' may include the memory cell array 110 and a read voltage determiner 160, and the memory controller 200' may include the program order manager 210 and the mapping table generator 220. The memory system 10' of the present exemplary embodiment is a modification of the memory system 10 of FIG. 1, and the same reference numerals denote the same elements. The following will focus on a difference between the memory system 10' of the present exemplary embodiment and the memory system 10 of FIG. 1.

According to the present exemplary embodiment, the read voltage determiner 160 may be included in the memory device 100'. The memory cell array 110 may store program order information that is generated by the program order manager 210 and first through third mapping tables that are generated by the mapping table generator 220. The read voltage determiner 160 may variably determine a read voltage for performing a read operation on the memory cell array 110 based on the program order information and the first through third mapping tables that are stored in the memory cell array 110.

In detail, when a read command is received from the memory controller 200', an operation of the read voltage determiner 160 may start. In detail, the read voltage determiner 160 may search for a POS corresponding to a memory group to be read from among a plurality of memory groups based on the program order information, may search for a read voltage offset corresponding to the searched POS, and may perform a read operation on the memory group by using the searched read voltage offset.

Figure 27:
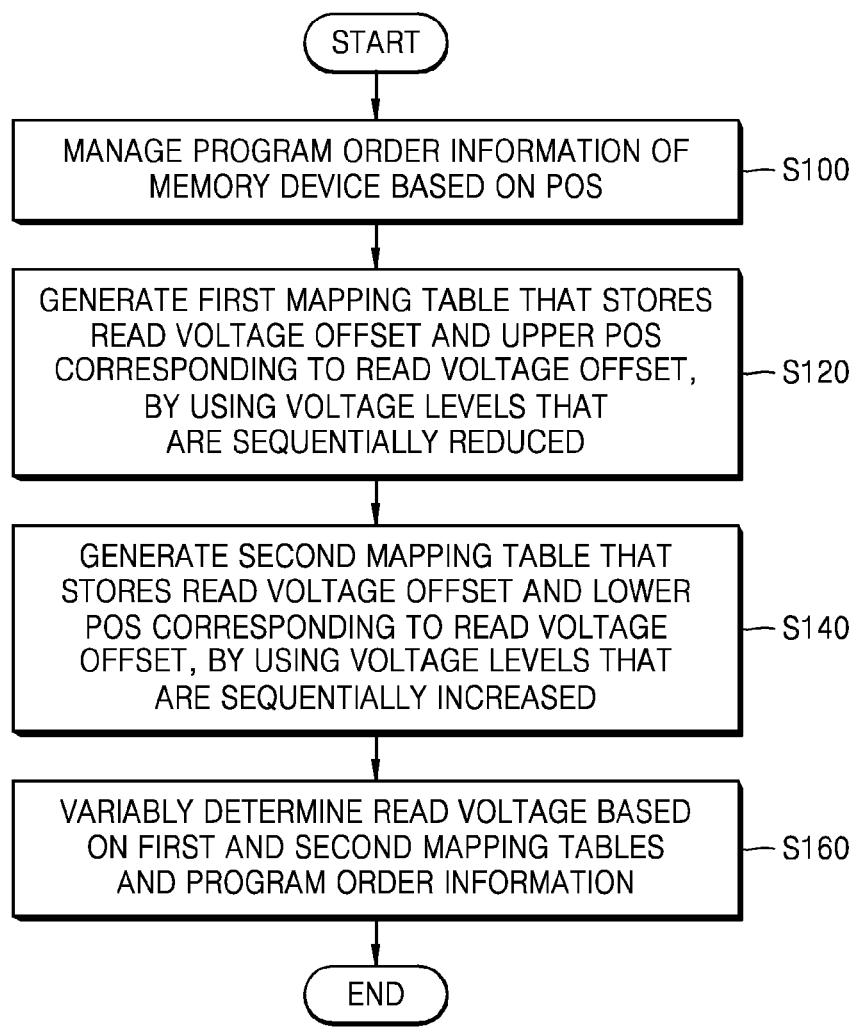
FIG. 27 is a flowchart of a method of operating a memory system, according to an exemplary embodiment.

FIG. 27 is a flowchart of a method of operating a memory system, according to an exemplary embodiment.

Referring to FIG. 27, the method according to the exemplary embodiment is a method of controlling a read voltage of a plurality of memory groups according to a program order of the plurality of memory groups that are included in a memory device. The description made with reference to FIGS. 1 through 26 applies to the method of the present exemplary embodiment. The method according to the present exemplary embodiment will now be explained in detail with reference to FIGS. 1 through 27.

In operation S100, program order information of the memory device is managed based on a POS. The term 'POS' indicates a relative temporal relationship between program operations of the plurality of memory groups that are included in the memory device. The program order information is information about a correlation between POSs and the plurality of memory groups.

In an exemplary embodiment, a program order manager may sequentially store POSs according to addresses of the plurality of memory groups so that the POSs may be searched according to the addresses of the plurality of memory groups. In another exemplary embodiment, the program order manager may store addresses of memory groups corresponding to POSs according to POSs that are sequentially increased so that the addresses of the plurality of memory groups may be searched according to the POSs.

In operation S120, a first mapping table that stores an upper POS corresponding to a read voltage offset is generated by using a plurality of voltage levels that are sequentially reduced (or decreased). The read voltage offset may be an offset of a read voltage that is initially set, that is, an offset of a default level, to perform a read operation on the memory device. The upper POS corresponding to the read voltage offset may be a POS allocated to a memory group whose read-out succeeds after a read operation is performed by using the voltage levels that are sequentially reduced. The upper POS may be determined to be close to an upper bound level of a read voltage range.

In operation S140, a second mapping table that stores a lower POS corresponding to a read voltage offset is generated by using a plurality of voltage levels that are sequentially increased. The lower POS corresponding to the read voltage offset may be a POS allocated to a memory group whose read-out succeeds after a read operation is performed by using the voltage levels that are sequentially increased. The lower POS may be determined to be close to a lower bound level of the read voltage range.

In operation S160, a read voltage is variably determined based on the first and second mapping tables and the program order information. In detail, a read voltage determiner may search for a POS corresponding to a memory group to be read from among the plurality of memory groups, may search for a read voltage offset corresponding to the searched POS, and may perform a read operation on the memory group by using the searched read voltage offset.

Figure 28:
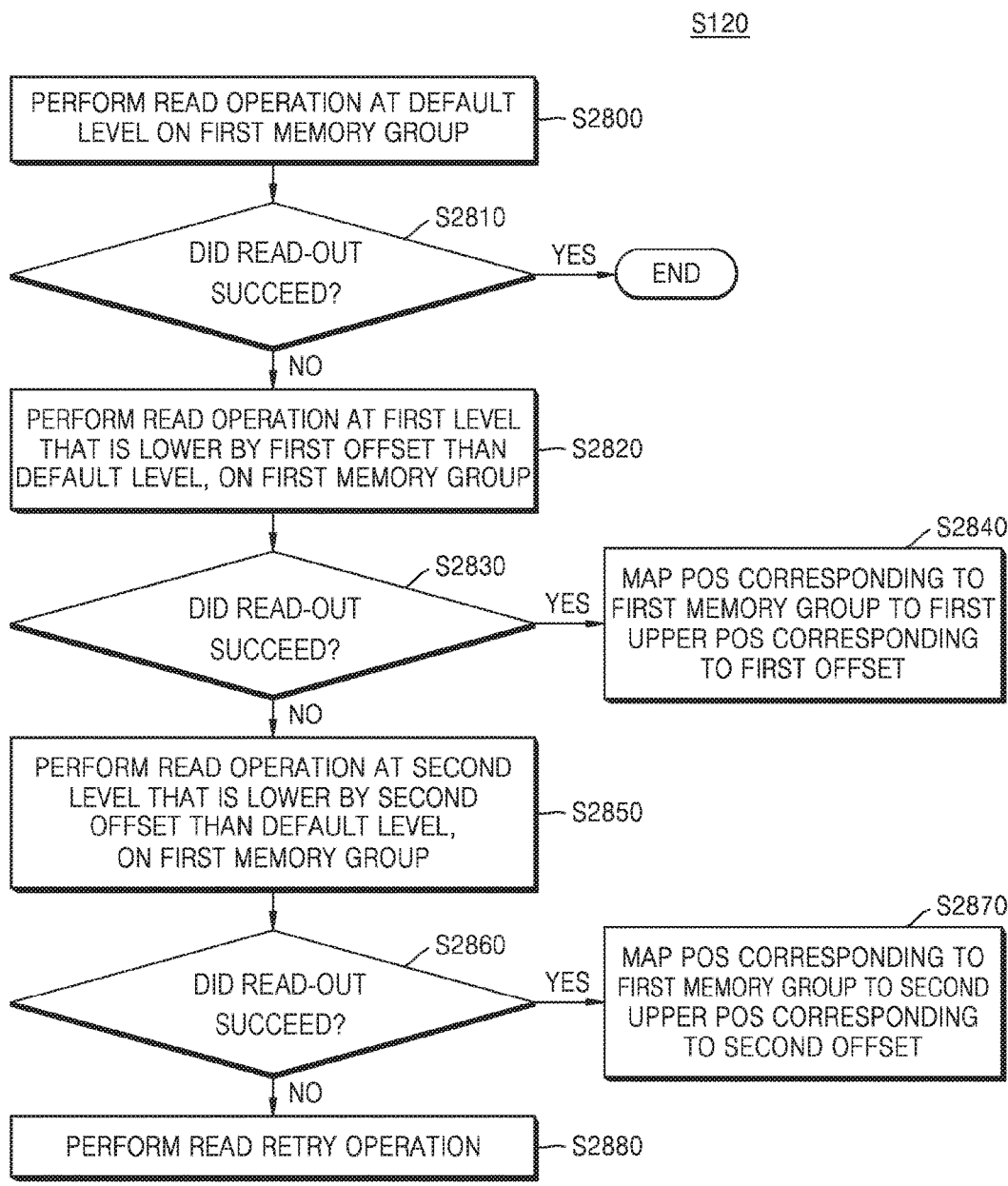
FIG. 28 is a flowchart of an operation of generating a first mapping table in operation S120 of the method of FIG. 27, according to an exemplary embodiment.

FIG. 28 is a flowchart of an operation of generating a first mapping table in operation S120 of the method of FIG. 27, according to an exemplary embodiment.

Referring to FIG. 28, the operation of generating the first mapping table according to the present exemplary embodiment may be performed by the mapping table generator 220 of FIGS. 1 and 9. The operation of generating the first mapping table will now be explained in detail with reference to FIGS. 1, 9, 20A through 22B, and 28.

In operation S2800, a read operation is performed at the default level Vdef on a first memory group. In operation S2810, it is determined whether a read-out succeeds. When it is determined in operation S2810 that the read-out succeeds, the present operation ends, and when it is determined in operation S2810 that the read-out fails, operation S2820 is performed.

In operation S2820, a read operation is performed at the first level V1 that is lower by a first offset than the default level Vdef on the first memory group. In operation S2830, it is determined whether a read-out succeeds. When it is determined in operation S2830 that the read-out succeeds, operation S2840 is performed, and when it is determined in operation S2830 that the read-out fails, operation S2850 is performed. In operation S2840, a POS corresponding to the first memory group is mapped to the first upper POS N1 corresponding to the first offset.

In operation S2850, a read operation is performed at the second level V2 that is lower by a second offset than the default level Vdef on the first memory group. A magnitude of the second offset is greater than a magnitude of the first offset. In operation S2860, it is determined whether a read-out succeeds. When it is determined in operation S2860 that the read-out succeeds, operation S2870 is performed, and when it is determined in operation S2860 that the read-out fails, operation S2880 is performed. In operation S2870, the POS corresponding to the first memory group is mapped to the second upper POS N2 corresponding to the second offset.

In operation S2880, a read retry operation is performed. In detail, a flag may be set so that a result obtained after performing the read operation on the first memory group is not used to update first through third mapping tables, and a read retry operation for searching for a valley between two adjacent distributions may be performed on the first memory group.

Figure 29:
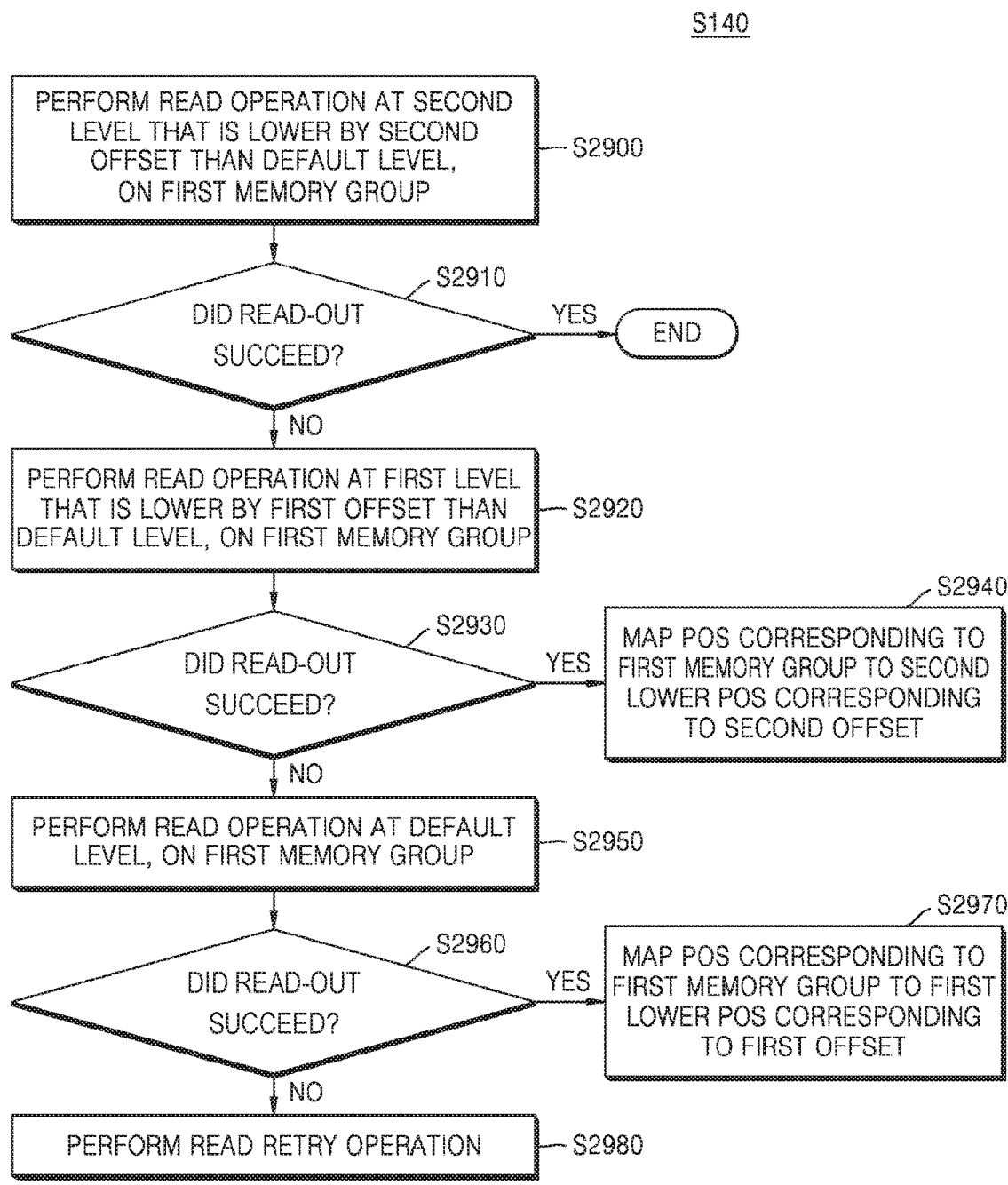
FIG. 29 is a flowchart of an operation of generating a second mapping table in operation S140 of the method of FIG. 27, according to an exemplary embodiment.

FIG. 29 is a flowchart of an operation of generating a second mapping table in operation S140 of the method of FIG. 27, according to an exemplary embodiment.

Referring to FIG. 29, the operation of generating the second mapping table according to the present exemplary embodiment may be performed by the mapping table generator 220 of FIGS. 1 and 9. The operation of generating the second mapping table will now be explained in detail with reference to FIGS. 1, 9, and 23A through 25B.

In operation S2900, a read operation is performed at the second level V2 that is lower by a second offset than the default level Vdef on the first memory group. In operation S2910, it is determined whether a read-out succeeds. When it is determined in operation S2910 that the read-out succeeds, the present operation ends, and when it is determined in operation S2910 that the read-out fails, operation S2920 is performed.

In operation S2920, a read operation is performed at the first level V1 that is lower by a first offset than the default level Vdef. A magnitude of the first offset is less than a magnitude of the second offset. In operation S2930, it is determined whether a read-out succeeds. When it is determined in operation S2930 that the read-out succeeds, operation S2940 is performed, and when it is determined in operation S2930 that the read-out fails, operation S2950 is performed. In operation S2940, a POS corresponding to the first memory group is mapped to the second lower POS N4 corresponding to the second offset.

In operation S2950, a read operation is performed at the default level Vdef on the first memory group. In operation S2960, it is determined whether a read-out succeeds. When it is determined in operation S2960 that the read-out succeeds, operation S2970 is performed, and when it is determined in operation S2960 that the read-out fails, operation S2980 is performed. In operation S2970, the POS corresponding to the first memory group is mapped to the first lower POS N3 corresponding to the first offset.

In operation S2980, a read retry operation is performed. In detail, a flag may be set so that a result obtained after a read operation is performed on the first memory group is not used to update first through third mapping tables, and a read retry operation for searching for a valley between two adjacent distributions may be performed on the first memory group.

Figure 30:
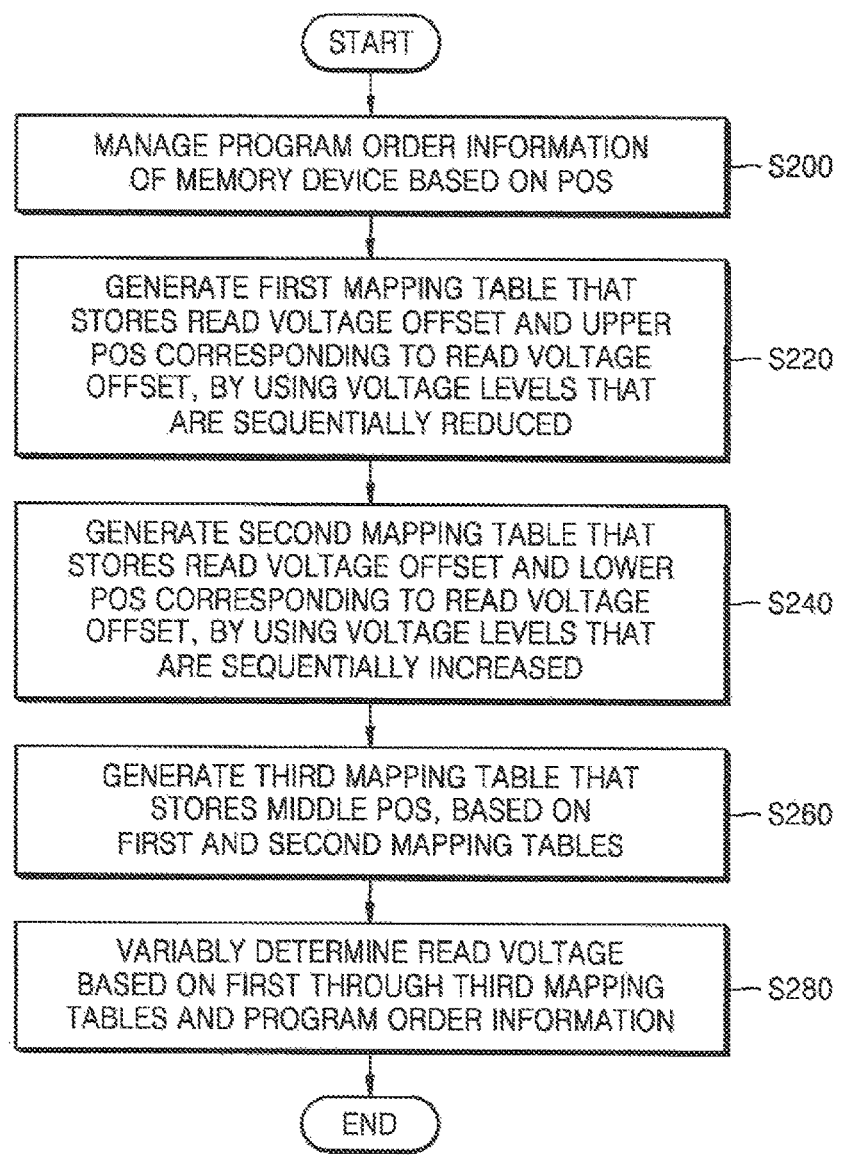
FIG. 30 is a flowchart of a method of operating a memory system, according to another exemplary embodiment.

FIG. 30 is a flowchart of a method of operating a memory system, according to another exemplary embodiment.

Referring to FIG. 30, the method according to the present exemplary embodiment is a modification of the method of FIG. 27, and may further include an operation of generating a third mapping table when compared to the method of FIG. 27. Accordingly, the description made with reference to FIGS. 1 through 29 applies to the method according to the present exemplary embodiment. The method according to the present exemplary embodiment will now be explained in detail with reference to FIGS. 1 through 30.

In operation S200, program order information of a memory device is managed based on a POS. In operation S220, a first mapping table that stores an upper POS corresponding to a read voltage offset is generated by using a plurality of voltage levels that are sequentially reduced. In operation S240, a second mapping table that stores a lower POS corresponding to the read voltage offset is generated by using a plurality of voltage levels that are sequentially increased.

In operation S260, a third mapping table that stores a middle POS is generated based on the first and second mapping tables. The middle POS may correspond to an average value of the upper POS and the lower POS.

In operation S280, a read voltage is variably determined based on the first through third mapping tables and the program order information. In detail, a read voltage determiner may search for a POS corresponding to a memory group to be read from among a plurality of memory groups based on the program order information, may search for a read voltage offset corresponding to the searched POS, and may perform a read operation on the memory group by using the searched read voltage offset.

Figure 31:
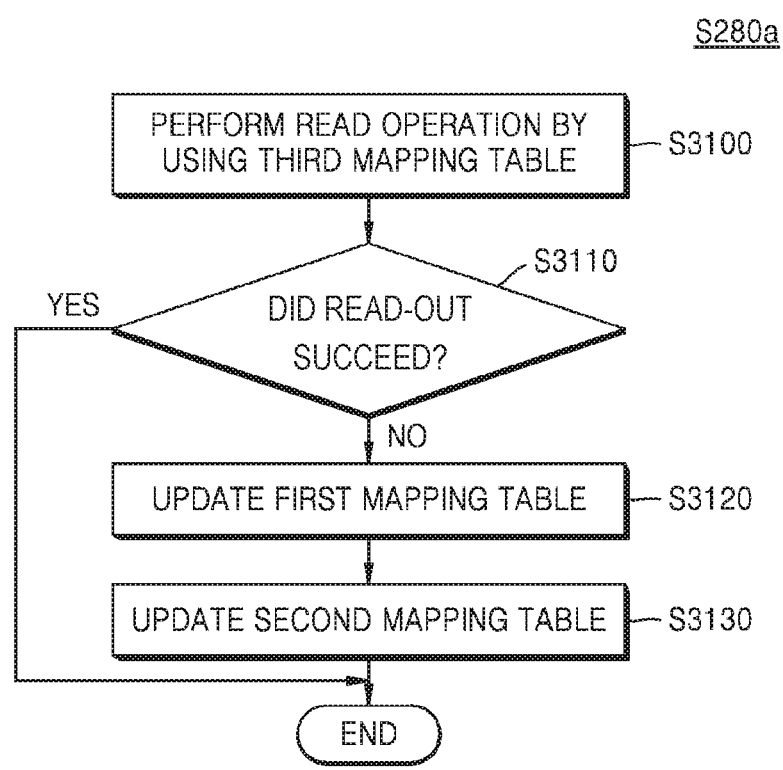
FIG. 31 is a flowchart of an operation of determining a read voltage in operation S280 of the method of FIG. 30, according to an exemplary embodiment.

FIG. 31 is a flowchart of an operation of determining a read voltage in operation S280 of the method of FIG. 30, according to an exemplary embodiment.

Referring to FIG. 31, in operation S3100, a read operation is performed by using the third mapping table. In operation S3110, it is determined whether a read-out succeeds. When it is determined in operation S3110 that the read-out succeeds, the present operation ends, and when it is determined in operation S3110 that the read-out fails, operation S3120 is performed. In operation S3120, the first mapping table is updated. In operation S3130, the second mapping table is updated. An order in which operation S3120 and operation S3130 are performed may be changed. Accordingly, the second mapping table may be updated, and then the first mapping table may be updated.

Figure 32:
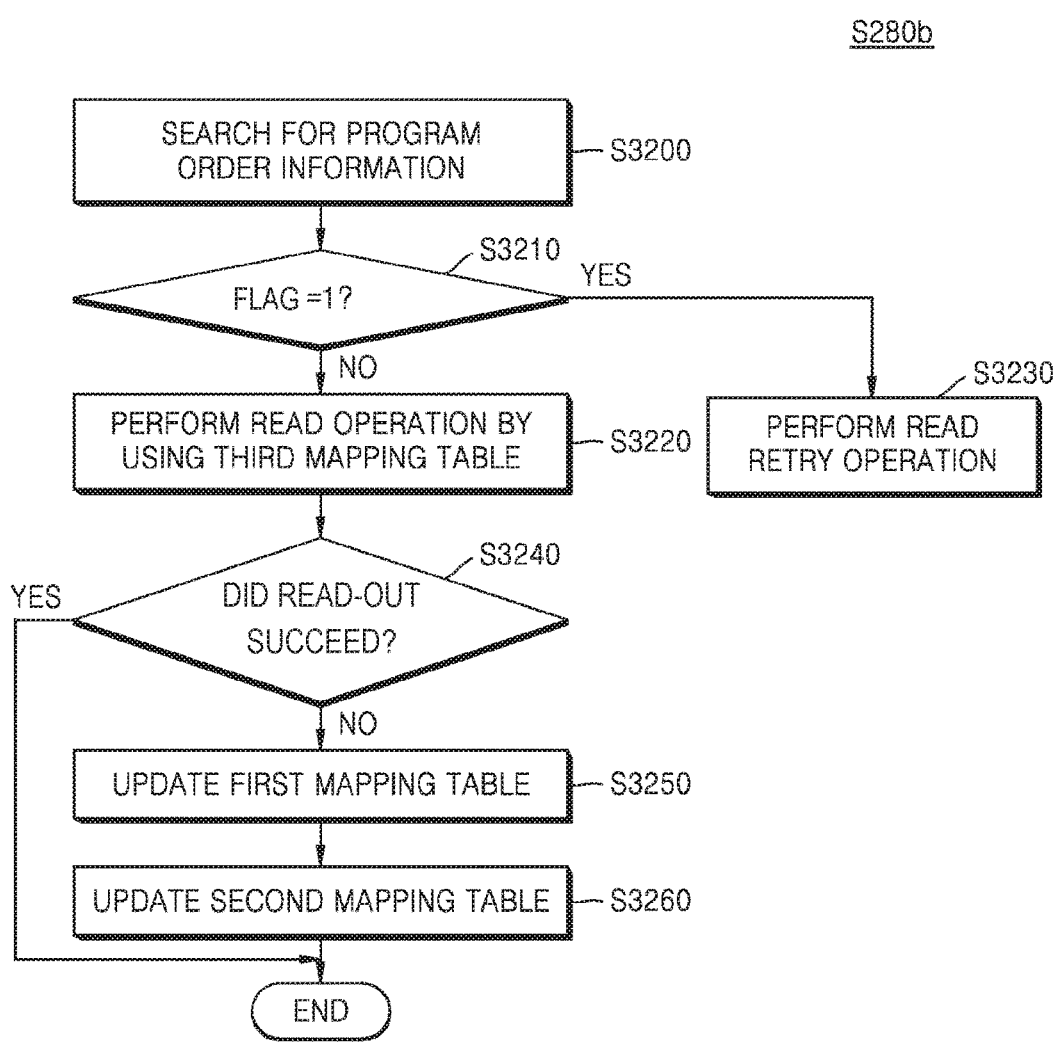
FIG. 32 is a flowchart of an operation of determining a read voltage in operation S280 of the method of FIG. 30, according to another exemplary embodiment.

FIG. 32 is a flowchart of an operation of determining a read voltage in operation S280 of the method of FIG. 30, according to another exemplary embodiment.

Referring to FIG. 32, the operation of determining the read voltage according to the present exemplary embodiment is a modification of the operation of determining the read voltage of FIG. 31 and further includes operations of searching for program order information and checking a flag when compared to the operation of FIG. 31, and an operation may be performed as a result obtained after checking the flag.

In operation S3200, program order information is searched for. The read voltage determiner 230 may search for the program order information of a memory group to be currently read, and may obtain a POS corresponding to an address of the memory group to be currently read.

In operation S3210, a flag that is included in the program order information may be checked and it is determined whether the flag is 1. The flag indicates whether a memory block may be used to update a mapping table. When it is determined that the flag is 0, operation S3220 is performed, and when it is determined that the flag is 1, operation S3230 is performed.

In operation S3230, a read retry operation is performed. In detail, a read retry operation for searching for a valley between two adjacent distributions may be performed on the memory device.

In operation S3220, a read operation is performed by using the third mapping table. In operation S3240, it is determined whether a read-out succeeds. When it is determined in operation S3240 that the read-out succeeds, the present operation ends, and when it is determined in operation S3240 that the read-out fails, operation S3250 is performed. In operation S3250, the first mapping table is updated. In operation S3260, the second mapping table is updated. An order in which operation S3250 and operation S3260 are performed may be changed. Accordingly, the second mapping table may be updated, and then the first mapping table may be updated.

Figure 33:
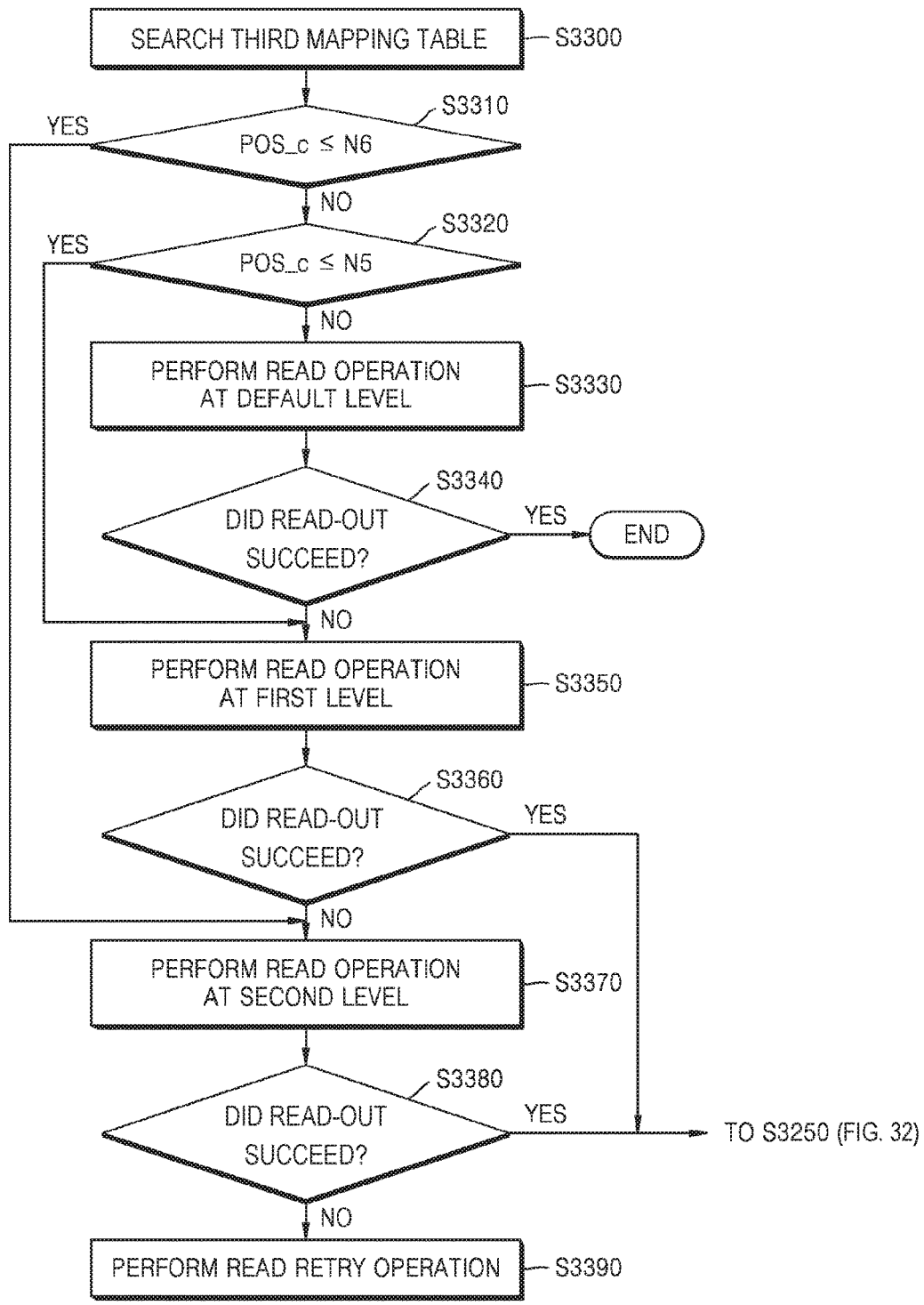
FIG. 33 is a flowchart of a read operation using a third mapping table in operation S3220 of the operation of FIG. 32, according to an exemplary embodiment.

FIG. 33 is a flowchart of a read operation using a third mapping table in operation S3220 of the operation of FIG. 32, according to an exemplary embodiment.

Referring to FIG. 33, the read operation using the third mapping table according to the present exemplary embodiment may be referred to as an average flow. The read operation using the third mapping table may be performed by the read operation determiner 230 of FIGS. 1 and 9. The read operation using the third mapping table will now be explained in detail with reference to FIGS. 1, 9, 17, and 18.

In operation S3300, the third mapping table is searched. The read voltage determiner 230 may search the third mapping table and may obtain the middle POSs N5 and N6 (hereinafter, referred to as first and second middle POSs N5 and N6).

In operation S3310, a current POS POS_c and the second middle POS N6 are compared with each other. When the current POS POS_c is equal to or less than the second middle POS N6, operation S3370 is performed, and otherwise, operation S3320 is performed.

In operation S3320, the current POS POS_c and the first middle POS N5 are compared with each other. When the current POS POS_c is equal to or less than the first middle POS N5, operation S3350 is performed, and otherwise, operation S3330 is performed.

In operation S3330, a read operation is performed at the default level Vdef. In operation S3340, it is determined whether a read-out succeeds. When it is determined in operation S3340 that the read-out succeeds, the present operation ends, and when it is determined in operation S3340 that the read-out fails, operation S3350 is performed.

In operation S3350, a read operation is performed at the first level V1. In operation S3360, it is determined whether a read-out succeeds. When it is determined in operation S3360 that the read-out succeeds, the present operation returns to operation S3250 (FIG. 32) in which the first mapping table is updated, and when it is determined in operation S3360 that the read-out fails, operation S3370 is performed.

In operation S3370, a read operation is performed at the second level V2. In operation S3380, it is determined whether a read-out succeeds. When it is determined in operation S3380 that the read-out succeeds, the present operation returns to operation S3250 (FIG. 32) in which the first mapping table is updated, and when it is determined in operation S3380 that the read-out fails, operation S3390 is performed.

In operation S3390, a read retry operation is performed. In detail, a read retry operation for searching for a valley between two adjacent distributions may be performed on the memory device.

Figure 34:
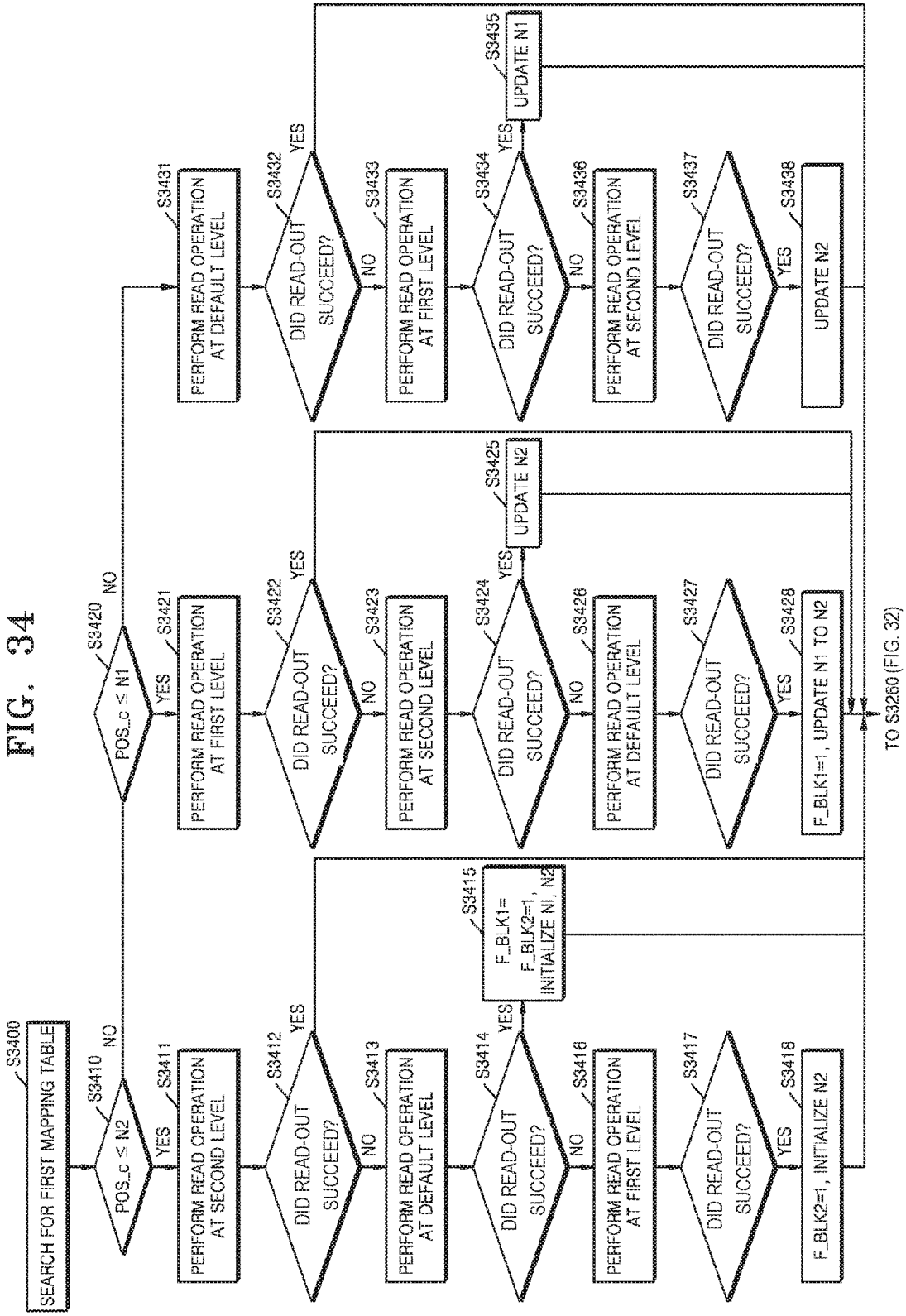
FIG. 34 is a flowchart of an operation of updating a first mapping table in operation S3250 of the operation of FIG. 32, according to an exemplary embodiment.

FIG. 34 is a flowchart of an operation of updating a first mapping table in operation S3250 of the operation of FIG. 32, according to an exemplary embodiment.

Referring to FIG. 34, according to the operation of updating the first mapping table according to the present exemplary embodiment, a value of an upper POS that is stored in the first mapping table may be increased, and thus the operation of updating the first mapping table may be referred to as a forward flow. The operation of updating the first mapping table may be performed by the mapping table generator 220 of FIGS. 1 and 9. The operation of updating the first mapping table will now be explained in detail with reference to FIGS. 1, 9, 17, 18 and 34.

In operation S3400, the first mapping table that was previously generated is searched for. The first mapping table may store a read voltage offset and an upper POS corresponding to the read voltage offset. In FIG. 17, the first mapping table MP1 may store the first upper POS N1 corresponding to the first offset OFFSET1, an address of the first memory block BLK1 corresponding to the first upper POS N1, and an index of the word line WL1 corresponding to the first upper POS N1. Also, the first mapping table MP1 may store the second upper POS N2 corresponding to the second offset OFFSET2, an address of the second memory block BLK2 corresponding to the second upper POS N2, and an index of the word line WL2 corresponding to the second upper POS N2.

In operation S3410, the current POS POS_c and the second upper POS N2 are compared with each other. When the current POS POS_c is equal to or less than the second upper POS N2, operation S3411 is performed, and otherwise, operation S3420 is performed.

In operation S3420, the current POS POS_c and the first upper POS N1 are compared with each other. When the current POS POS_c is equal to or less than the first upper POS N1, operation S3421 is performed, and otherwise, operation S3431 is performed.

In operation S3411, a read operation is performed at the second level V2. The second level V2 is lower by the second offset OFFSET2 than the default level Vdef. In operation S3412, it is determined whether a read-out succeeds. When it is determined in operation S3412 that the read-out succeeds, the second mapping table is updated in operation S3260 (FIG. 32), and when it is determined in operation S3412 that the read-out fails, operation S3413 is performed.

In operation S3413, a read operation is performed at the default level Vdef. In operation S3414, it is determined whether a read-out succeeds. When it is determined in operation S3414 that the read-out succeeds, operation S3415 is performed, and when it is determined in operation S3414 that the read-out fails, operation S3416 is performed.

In operation S3415, a flag F_BLK1 of the first memory block BLK1 and a flag F_BLK2 of the second memory block BLK2 are set to 1, the first and second upper POSs N1 and N2 are initialized, and the second mapping table is updated in operation S3260 (FIG. 32). When the current POS POS_c is equal to or less than the second upper POS N2 but the read-out succeeds at the default level Vdef, it is found that the first and second upper POSs N1 and N2 are wrongly determined. Accordingly, the first and second upper POSs N1 and N2 may be initialized, and the flags F_BLK1 and F_BLK2 of the first and second memory blocks BLK1 and BLK2 may be set to 1 (in operation S3415) so that a result obtained after the read operation is performed on the first and second memory blocks BLK1 and BLK2 respectively corresponding to the first and second upper POSs N1 and N2 is not used to update the first mapping table.

In operation S3416, a read operation is performed at the first level V1. The first level V1 is lower by the first offset OFFSET1 than the default level Vdef. In operation 53417, it is determined whether a read-out succeeds. When it is determined in operation 53417 that the read-out succeeds, operation S3418 is performed.

In operation S3418, the flag F_BLK2 of the second memory block BLK2 is set to 1, the second upper POS N2 is initialized, and then the second mapping table is updated in operation S3260 (FIG. 32). When the current POS POS_c is equal to or less than the second upper POS N2 but the read-out succeeds at the first level V1, it is found that the second upper POS N2 is wrongly determined. Accordingly, the second upper POS N2 may be initialized, and the flag F_BLK2 of the second memory block BLK2 may be set to 1 (in operation S3418) so that a result obtained after the read operation is performed on the second memory block BLK2 corresponding to the second upper POS N2 is not used to update the first mapping table.

In operation S3421, a read operation is performed at the first level V1. In operation S3422, it is determined whether a read-out succeeds. When it is determined in operation S3422 that the read-out succeeds, the second mapping table is updated in operation S3260 (FIG. 32), and when it is determined in operation S3422 that the read-out fails, operation S3423 is performed.

In operation S3423, a read operation is performed at the second level V2. In operation S3424, it is determined whether a read-out succeeds. When it is determined in operation S3424 that the read-out succeeds, operation S3425 is performed, and when it is determined in operation S3424 that the read-out fails, operation S3426 is performed.

In operation S3425, the second upper POS N2 is updated to the current POS POS_c, and then, the second mapping table is updated in operation S3260 (FIG. 32).

In operation S3426, a read operation is performed at the default level Vdef. In operation S3427, it is determined whether a read-out succeeds. When it is determined in operation S3427 that the read-out succeeds, operation S3428 is performed.

In operation S3428, the flag F_BLK1 of the first memory block BLK1 is set to 1, the first upper POS N1 is updated to the second upper POS N2, and then the second mapping table is updated in operation S3260 (FIG. 32). When the current POS POS_c is equal to or less than the first upper POS N1 but the read-out succeeds at the default level Vdef, it is found that the first upper POS N1 is wrongly determined. Accordingly, the flag F_BLK1 of the first memory block BLK1 may be set to 1 (in operation S3428) so that a result obtained after the read operation is performed on the first memory block BLK1 corresponding to the first upper POS N1 is not used to update the first mapping table, and the first upper POS N1 is updated to the second upper POS N2.

In operation S3431, a read operation is performed at the default level Vdef. In operation S3432, it is determined whether a read-out succeeds. When it is determined in operation S3432 that the read-out succeeds, the second mapping table is updated in operation S3260 (FIG. 32), and when it is determined in operation S3432 that the read-out fails, operation S3433 is performed.

In operation S3433, a read operation is performed at the first level V1. In operation S3434, it is determined whether a read-out succeeds. When it is determined in operation S3434 that the read-out succeeds, operation S3435 is performed, and when it is determined in operation S3434 that the read-out fails, operation S3436 is performed.

In operation S3435, the first upper POS N1 is updated to the current POS POS_c. Next, the second mapping table is updated in operation S3260 (FIG. 32).

In operation S3436, a read operation is performed at the second level V2. In operation S3437, it is determined whether a read-out succeeds. When it is determined that the read-out succeeds, operation S3438 is performed.

In operation S3438, the second upper POS N2 is updated to the current POS POS_c. Next, the second mapping table is updated in operation S3260 (FIG. 32).

The forward flow may rapidly update the first mapping table when read operations are sequentially performed beginning from memory groups having a short time after a program operation is completed, that is, beginning from latest data. In other words, the forward flow may be useful when read operations are sequentially performed beginning from memory groups having a short retention time, that is, from memory groups each having a large POS.

Figure 35:
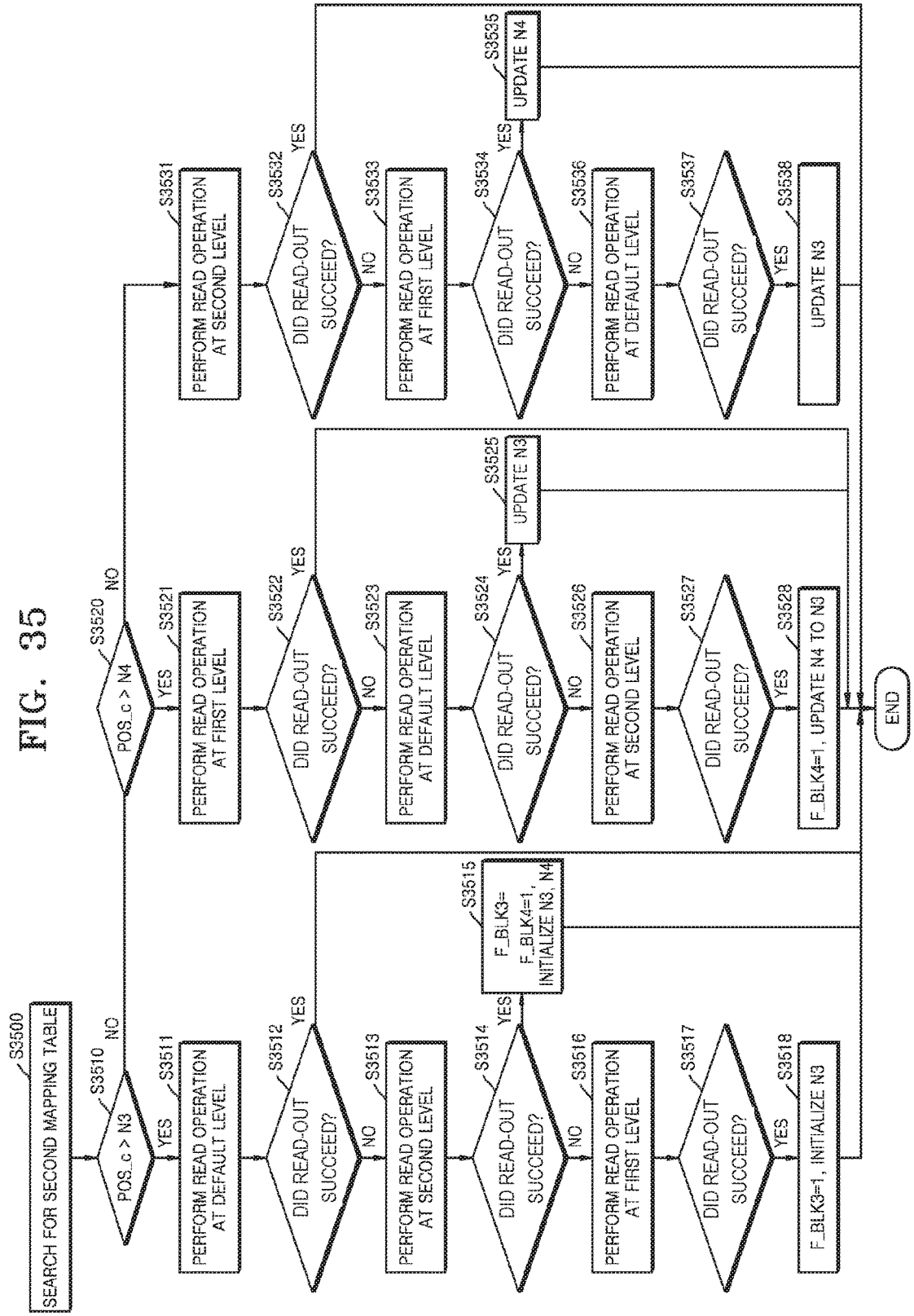
FIG. 35 is a flowchart of an operation of updating a second mapping table in operation S3260 of the operation of FIG. 32, according to an exemplary embodiment.

FIG. 35 is a flowchart of an operation of updating a second mapping table in operation S3260 of the operation of FIG. 32, according to an exemplary embodiment.

Referring to FIG. 35, according to the operation of updating the second mapping table of the present exemplary embodiment, a value of a lower POS that is stored in the second mapping table may be reduced, and thus the operation of updating the second mapping table may be referred to as a backward flow. The operation of updating the second mapping table may be performed by the mapping table generator 220 of FIGS. 1 and 9. The operation of updating the second mapping table will now be explained in detail with reference to FIGS. 1, 9, 17, 18 and 35.

In operation S3500, the second mapping table that was previously generated is searched for. The second mapping table may store a read voltage offset and a lower POS corresponding to the read voltage offset. In FIG. 17, the second mapping table MP2 may store the first lower POS N3 corresponding to the first offset OFFSET1, an address of the third memory block BLK3 corresponding to the first lower POS N3, and an index of the word line WL3 corresponding to the first lower POS N3. Also, the second mapping table MP2 may store the second lower POS N4 corresponding to the second offset OFFSET2, and an address of the fourth memory block BLK4 corresponding to the second lower POS N4, and an index of the word line WL4 corresponding to the second lower POS N4.

In operation S3510, the current POS POS_c and the first lower POS N3 are compared with each other. When the current POS POS_c is greater than the first lower POS N3, operation S3511 is performed, and otherwise, operation S3520 is performed.

In operation S3520, the current POS POS_c and the second lower POS N4 are compared with each other. When the current POS POS_c is greater than the second lower POS N4, operation S3521 is performed, and otherwise, operation S3531 is performed.

In operation S3511, a read operation is performed at the default level Vdef. In operation S3512, it is determined whether a read-out succeeds. When it is determined in operation S3512 that the read-out succeeds, the present operation ends, and when it is determined in operation S3512 that the read-out fails, operation S3513 is performed.

In operation S3513, a read operation is performed at the second level V2. The second level V2 is lower by the second offset OFFSET2 than the default level Vdef. In operation S3514, it is determined whether a read-out succeeds. When it is determined in operation S3514 that the read-out succeeds, operation S3515 is performed, and when it is determined in operation S3514 that the read-out fails, operation S3516 is performed.

In operation S3515, a flag F_BLK3 of the third memory block BLK3 and a flag F_BLK4 of the fourth memory block BLK4 are set to 1, the first and second lower POSs N3 and N4 are initialized, and the present operation ends. When the current POS POS_c is greater than the first lower POS N3 but the read-out succeeds at the second level V2, it is found that the first and second lower POSs N3 and N4 are wrongly determined. Accordingly, in this case, the first and second POSs N3 and N4 may be initialized, and the flags F_BLK3 and F_BLK4 of the third and fourth memory blocks BLK3 and BLK4 may be set to 1 (in operation S3515) so that a result obtained after the read operation is performed on the third and fourth memory blocks BLK3 and BLK4 respectively corresponding to the first and second lower POSs N3 and N4 is not used to update the second mapping table.

In operation S3516, a read operation is performed at the first level V1. The first level V1 is lower by the first offset OFFSET1 than the default level Vdef. In operation S3517, it is determined whether a read-out succeeds. When it is determined in operation S3517 that the read-out succeeds, operation S3518 is performed.

In operation S3518, the flag F_BLK3 of the third memory block BLK3 is set to 1, the first lower POS N3 is initialized, and the present operation ends. When the current POS POS_c is greater than the first lower POS N3 but the read-out succeeds at the first level V1, it is found that the first lower POS N3 is wrongly determined. Accordingly, the first lower POS N3 may be initialized, and the flag F_BLK3 of the third memory block BLK3 may be set to 1 (in operation S3518) so that a result obtained after the read operation is performed on the third memory block BLK3 corresponding to the first lower POS N3 is not used to update to the second mapping table.

In operation S3521, a read operation is performed at the first level V1. In operation S3522, it is determined whether a read-out succeeds. When it is determined in operation S3522 that the read-out succeeds, the present operation ends, and when it is determined in operation S3522 that the read-out fails, operation S3523 is performed.

In operation S3523, a read operation is performed at the default level Vdef. In operation S3524, it is determined whether a read-out succeeds. When it is determined in operation S3524 that the read-out succeeds, operation S3525 is performed, and when it is determined in operation S3524 that the read-out fails, operation S3526 is performed.

In operation S3525, the first lower POS N3 is updated to the current POS POS_c and the present operation ends.

In operation S3526, a read operation is performed at the second level V2. In operation S3527, it is determined whether a read-out succeeds. When it is determined in operation S3527 that the read-out succeeds, operation S3528 is performed.

In operation S3528, the flag F_BLK4 of the fourth memory block BLK4 is set to 1, the second lower POS N4 is updated to the first lower POS N3, and the present operation ends. When the current POS POS_c is greater than the second lower POS N4 but the read-out succeeds at the second level V2, it is found that the second lower POS N4 is wrongly determined. Accordingly, the flag F_BLK4 of the fourth memory block BLK4 may be set to 1 (in operation S3528) so that a result obtained after the read operation is performed on the fourth memory block BLK4 corresponding to the second lower POS N4 is not used to update the second mapping table, and the second lower POS N4 may be updated to the first lower POS N3.

In operation S3531, a read operation is performed at the second level V2. In operation S3532, it is determined whether a read-out succeeds. When it is determined in operation S3532 that the read-out succeeds, the present operation ends, and when it is determined in operation S3532 that the read-out fails, operation S3533 is performed.

In operation S3533, a read operation is performed at the first level V1. In operation S3534, it is determined whether a read-out succeeds. When it is determined in operation S3534 that the read-out succeeds, operation S3535 is performed, and when it is determined in operation S3534 that the read-out fails, operation S3536 is performed.

In operation S3535, the second lower POS N4 is updated to the current POS POS_c and the present operation ends.

In operation S3536, a read operation is performed at the default level Vdef. In operation S3537, it is determined whether a read-out succeeds. When it is determined in operation S3537 that the read-out succeeds, operation S3538 is performed.

In operation S3538, the first lower POS N3 is updated to the current POS POS_c, and the present operation ends.

When the operations of updating the first and second mapping tables of FIGS. 34 and 35 are completed, the third mapping table may be updated. Although the first mapping table is first updated and then the second mapping table is updated in the above, the inventive concept is not limited thereto. In another exemplary embodiment, the second mapping table may be first updated and then the first mapping table may be updated.

The backward flow may rapidly update the second mapping table when read operations are sequentially performed beginning from memory groups having a long time after a program operation is completed, that is, from old data. In other words, the backward flow may be useful when read operations are sequentially performed beginning from memory groups having a long retention time, that is, from memory groups each having a small program order stamp (POS).

Figure 36:
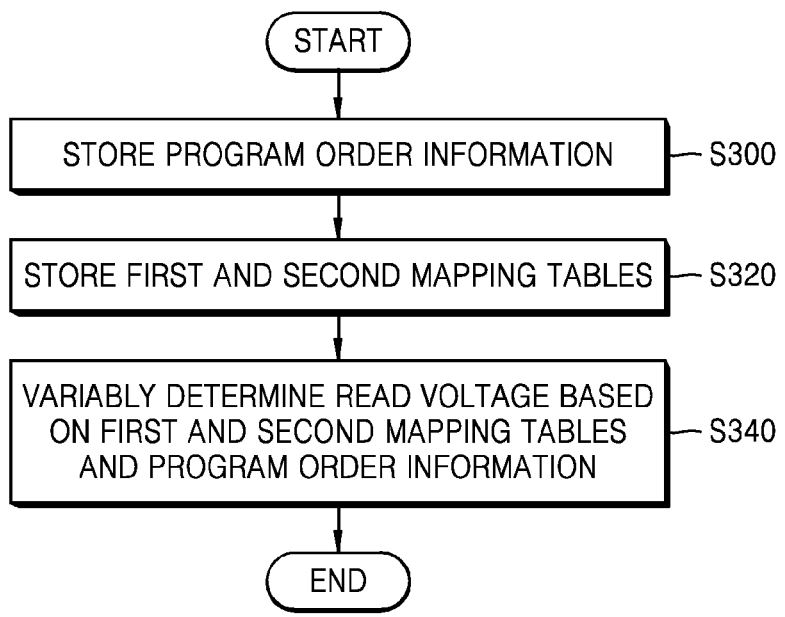
FIG. 36 is a flowchart of a method of operating a memory device, according to an exemplary embodiment.

FIG. 36 is a flowchart of a method of operating a memory device, according to an exemplary embodiment.

Referring to FIG. 36, the method according to the present exemplary embodiment is a method of controlling a read voltage of a plurality of memory groups according to a program order of the plurality of memory groups that are included in the memory device, and the description made with reference to FIGS. 1 through 35 applies to the method according to the present exemplary embodiment. The method according to the present exemplary embodiment will now be explained in detail with reference to FIGS. 1 through 26 and 36.

In operation S300, program order information is stored. In detail, the memory cell array 110 may store the program order information. The program order information may be generated by the program order manager 210.

In operation S320, first and second mapping tables are stored. In detail, the memory cell array 110 may store the first and second mapping tables MP1 and MP2. The first and second mapping tables MP1 and MP2 may be generated by the mapping table generator 220 that is included in the memory controller 200. The first mapping table MP1 may store an upper POS corresponding to a read voltage offset, and the second mapping table MP2 may store a lower POS corresponding to the read voltage offset.

In operation S340, a read voltage is controlled or determined based on the first and second mapping tables and the program order information. In detail, the read voltage determiner 230 may control the read voltage according to a retention time based on the first and second mapping tables MP1 and MP2 and the program order information.

In another exemplary embodiment, the method may further include an operation of storing the third mapping table MP3, and the controlling of the read voltage may include controlling the read voltage based on the first through third mapping tables MP1, MP2, and MP3 and the program order information. The third mapping table MP3 may store the read voltage offset and a middle POS that corresponds to an average value between the upper POS and the lower POS.

Figure 37:
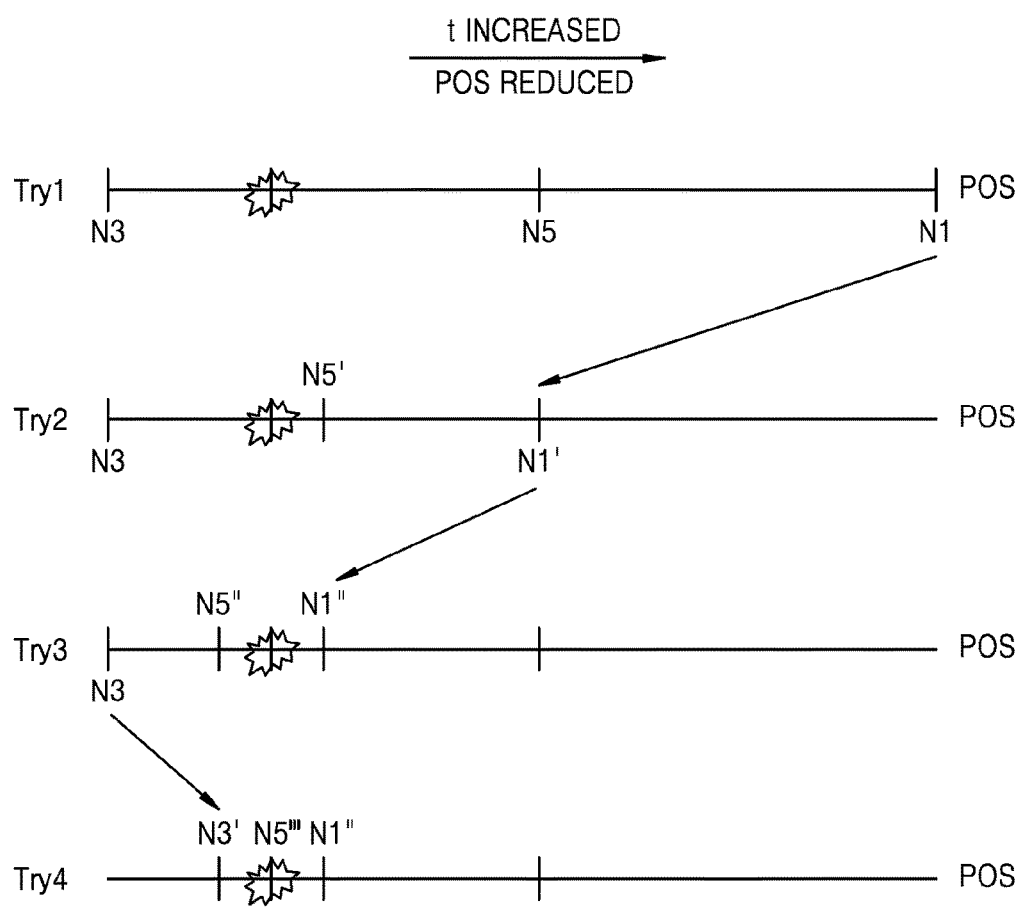
FIG. 37 is a diagram for explaining a binary search operation according to an exemplary embodiment.

FIG. 37 is a diagram for explaining a binary search operation according to an exemplary embodiment.

Referring to FIG. 37, according to the above exemplary embodiments, a first mapping table including upper POSs N1, N1' and N1" may be generated according to a forward flow (by using read voltage levels that are sequentially reduced), a second mapping table including lower POSs N3 and N3' may be generated according to a backward flow (by using read voltage levels that are sequentially increased), and a third mapping table including middle POSs N5, N5' and N5" may be generated according to an average value between POSs that are stored in the first and second mapping tables. For example, the middle POS N5 corresponds to an average value between the upper POS N1 and the lower POS N3. A binary search operation (Try1 to Try4) may then be performed based on the generated first through third mapping tables. In particular, from Try1 to Try3, a first search is performed by using the upper POSs N1, N1' and N1", or the middle POSs N5, N5' and N5", and then from Try3 to Try4, a second search is performed by using the lower POSs N3 and N3' to provide an updated middle POS N5''', and thus a read voltage of a specific memory group may be rapidly determined, thereby further improving the performance and reliability of a memory system.

Figure 38:
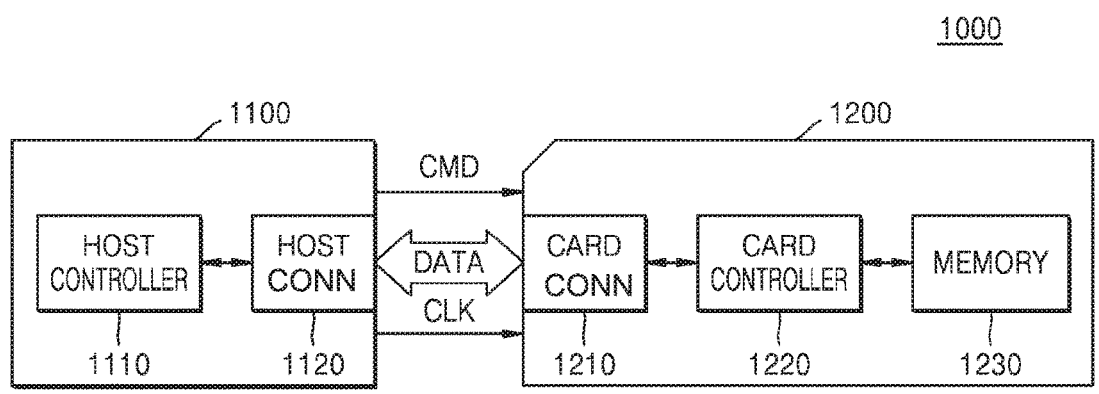
FIG. 38 is a block diagram illustrating a memory card system to which a memory system is applied, according to an exemplary embodiment.

FIG. 38 is a block diagram illustrating a memory card system 1000 to which a memory system is applied, according to an exemplary embodiment.

Referring to FIG. 38, the memory card system 1000 may include a host 1100 and a memory card 1200. The host 1100 may include a host controller 1110 and a host connector (HOST CONN) 1120. The memory card 1200 may include a card connector (CARD CONN) 1210, a card controller 1220, and a memory device 1230. In this case, the memory card 1200 may be formed by using the exemplary embodiments of FIGS. 1 through 37.

The host 1100 may write data to the memory card 1200 or may read data that is stored in the memory card 1200. The host controller 1110 may transmit a command CMD, a clock signal CLK that is generated by a clock generator (not shown) in the host 1100, and data DATA to the memory card 1200 through the host connector (HOST CONN) 1120.

The card controller 1220 may store the data DATA in the memory device 1230 in synchronization with a clock signal that is generated by a clock generator (not shown) in the card controller 1220, in response to the command CMD received through the card connector (CARD CONN) 1210. The memory device 1230 may store the data DATA that is transmitted from the host 1100.

The memory card 1200 may be a CompactFlash® (CF) card, a microdrive, a smart media card (SMC), a Multi-Media Card™ (MMC), a Secure Digital™ card (SD), a Memory Stick™ (MS), or a USB flash memory driver.

Figure 39:
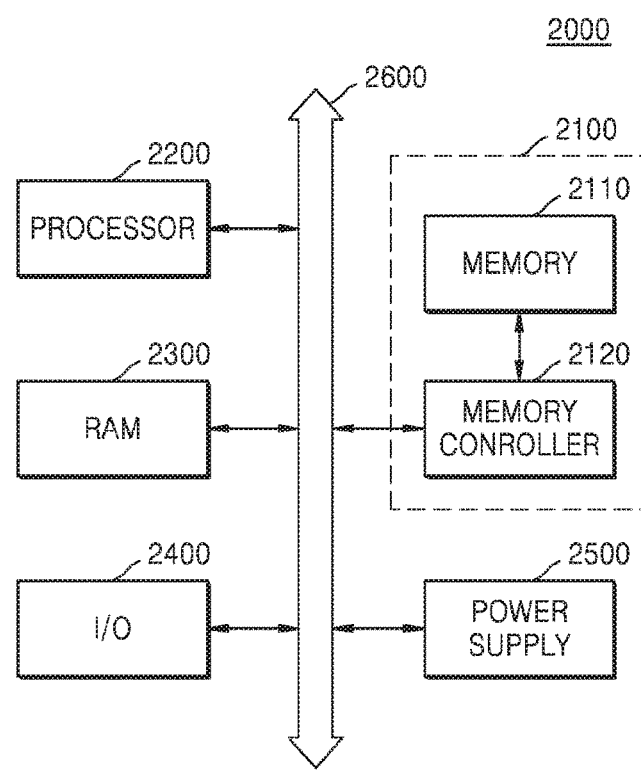
FIG. 39 is a block diagram illustrating a computing system including a memory system, according to an exemplary embodiment.

FIG. 39 is a block diagram illustrating a computing system 2000 including a memory system 2100, according to an exemplary embodiment.

Referring to FIG. 39, the computing system 2000 may include the memory system 2100, a processor 2200, a RAM 2300, an input/output device 2400, and a power supply 2500. Although not shown in FIG. 39, the computing system 2000 may further include ports that may communicate with a video card, a sound card, a memory card, a USB device, or other electronic devices. The computing system 2000 may be a personal computer, or a portable electronic device such as a laptop computer, a mobile phone, a personal digital assistant (PDA), or a camera.

The processor 2200 may perform specific calculations and tasks. According to exemplary embodiments, the processor 2200 may be a microprocessor or a CPU. The processor 220 may communicate with the RAM 2300, the input/output device 2400, and the memory system 2100 via a bus 2600 such as an address bus, a control bus, or a data bus. In this case, the memory system 2100 may be formed by using the exemplary embodiments of FIGS. 1 through 38.

According to exemplary embodiments, the processor 2200 may be connected to an expansion bus such as a PCI bus.

The RAM 2300 may store data that is necessary to operate the computing system 2000. For example, the RAM 2300 may be a DRAM, a mobile DRAM, an SRAM, a PRAM, a ferroelectric RAM (FRAM), an RRAM, and/or an MRAM.

The input/output device 2400 may include an input unit such as a keyboard, a keypad, and/or a mouse and an output unit such as a printer and/or a display. The power supply 2500 may supply an operating voltage that is necessary to operate the computing system 2000.

Figure 40:
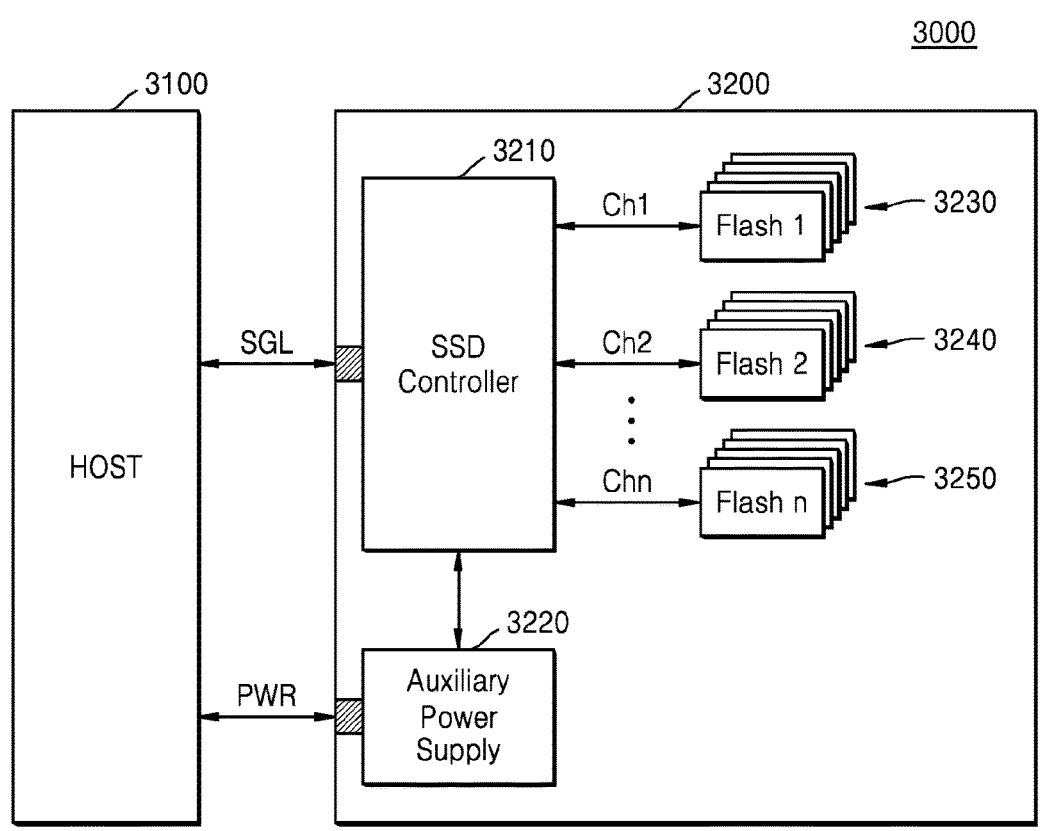
FIG. 40 is a block diagram illustrating a solid-state drive (SSD) system to which a memory system is applied, according to an exemplary embodiment.

FIG. 40 is a block diagram illustrating a solid-state drive (SSD) system 3000 to which a memory system is applied, according to an exemplary embodiment.

Referring to FIG. 40, the SSD system 3000 may include a host 3100 and an SSD 3200. The SSD 3200 transmits and receives a signal to and from the host 3100 through a signal connector, and receives power through a power connector. The SSD 3200 may include an SSD controller 3210, an auxiliary power supply 3220, and a plurality of memory devices 3230, 3240, and 3250. In this case, the SSD 3200 may be formed by using the exemplary embodiments of FIGS. 1 through 39.

As described above, according to the inventive concept, a program order of a plurality of memory groups that are included in a memory device may be managed by using a POS, and a first mapping table that stores a read voltage offset and an upper POS corresponding to the read voltage offset and a second mapping table that stores the read voltage offset and a lower POS corresponding to the read voltage offset may be rapidly formed. Accordingly, a binary search operation may be performed based on the first and second mapping tables, and thus a read voltage may be rapidly and accurately determined, thereby further improving the performance and reliability of a memory system.

While the inventive concept has been particularly shown and described with reference to exemplary embodiments thereof, it will be understood that various changes in form and details may be made therein without departing from the spirit and scope of the following claims.

What is claimed is:

1. A method of operating a memory system comprising a memory device, the method comprising:
managing program order information of the memory device based on a program order stamp (POS) indicating a program order of program operations of a plurality of memory groups that are included in the memory device;
generating a first mapping table that stores a read voltage offset and an upper POS corresponding to the read voltage offset, by performing a sequence of read operations on the memory device using a plurality of read voltage levels that are sequentially reduced;
generating a second mapping table that stores the read voltage offset and a lower POS corresponding to the read voltage offset, by performing a sequence of read operations on the memory device using a plurality of read voltage levels that are sequentially increased; and
variably determining a read voltage for performing a read operation on the plurality of memory groups, based on the first and second mapping tables and the program order information,
wherein a POS of value 1 is allocated to a memory group from among the plurality of memory groups on which a program operation is firstly performed, a POS of value 2 is allocated to a memory group on which a program operation is secondly performed, and a POS of value n is allocated to a memory group on which a program operation is nthly performed, wherein n is an integer greater than 2.

2. The method of claim 1, wherein the upper POS is determined to be close to an upper bound level of a read voltage range, and the lower POS is determined to be close to a lower bound level of the read voltage range.

3. The method of claim 1, wherein the generating of the first mapping table comprises:
when read-out fails after a read operation is performed using a read voltage level at a default level on a first memory group from among the plurality of memory groups, performing a read operation at a first level that is lower than the default level by a first read voltage offset; and
when read-out succeeds after a read operation is performed at the first level, mapping a POS corresponding to the first memory group to a first upper POS corresponding to the first read voltage offset.

4. The method of claim 3, wherein the generating of the first mapping table further comprises:
when read-out fails after a read operation is performed at the first level on the first memory group, performing a read operation at a second level that is lower than the default level by a second read voltage offset; and
when read-out succeeds after a read operation is performed at the second level, mapping the POS corresponding to the first memory group to a second upper POS corresponding to the second read voltage offset;
wherein a magnitude of the second read voltage offset is greater than a magnitude of the first read voltage offset.

5. The method of claim 1, wherein the generating of the second mapping table comprises:
when read-out fails after a read operation is performed using a read voltage level at a second level that is lower by a second read voltage offset than a default level on a first memory group from among the plurality of memory groups, performing a read operation at a first level that is lower than the default level by a first read voltage offset; and
when read-out succeeds after a read operation is performed at the first level, mapping a POS corresponding to the first memory group to a second lower POS corresponding to the second read voltage offset;
wherein a magnitude of the second read voltage offset is greater than a magnitude of the first read voltage offset.

6. The method of claim 5, wherein the generating of the second mapping table further comprises:
when read-out fails after a read operation is performed at the first level on the first memory group, performing a read operation at the default level; and
when read-out succeeds after a read operation is performed at the default level, mapping the POS corresponding to the first memory group to a first lower POS corresponding to the first read voltage offset.

7. The method of claim 1, further comprising generating a third mapping table that stores the read voltage offset and a middle POS corresponding to an average value between the upper POS and the lower POS corresponding to the read voltage offset, based on the first and second mapping tables;
wherein variably determining the read voltage comprises variably determining the read voltage based on the first through third mapping tables and the program order information.

8. The method of claim 1, wherein the plurality of memory groups are divided according to memory blocks, the upper and lower POSs are allocated according to the memory blocks, and the first and second mapping tables respectively store the read voltage offset and the upper and lower POSs according to the memory blocks.

9. The method of claim 1, wherein the plurality of memory groups are divided according to word lines, the upper and lower POSs are allocated according to the word lines, and the first and second mapping tables respectively store the read voltage offset and the upper and lower POSs according to the word lines.

10. A method of operating a memory system comprising a memory device, the method comprising:
managing program order information of the memory device based on a program order stamp (POS) indicating a program order of program operations of a plurality of memory groups that are included in the memory device;
generating a first mapping table that stores a read voltage offset and an upper POS corresponding to the read voltage offset, by performing a sequence of read operations on the memory device using a plurality of read voltage levels that are sequentially reduced;
generating a second mapping table that stores the read voltage offset and a lower POS corresponding to the read voltage offset, by performing a sequence of read operations on the memory device using a plurality of read voltage levels that are sequentially increased;
generating a third mapping table that stores the read voltage offset and a middle POS corresponding to an average value between the upper POS and the lower POS corresponding to the read voltage offset, based on the first and second mapping tables; and
variably determining a read voltage for performing a read operation on the plurality of memory groups, based on the first through third mapping tables and the program order information,
wherein variably determining the read voltage comprises:
comparing a current POS corresponding to a second memory group to be currently read from among the plurality of memory groups with a first middle POS corresponding to a first read voltage offset;
when the current POS is not less than the first middle POS, determining a read voltage of the second memory group as a default level; and
when the current POS is less than the first middle POS, determining the read voltage of the second memory group as a first level that is lower than the default level by the first read voltage offset.

11. The method of claim 10, further comprising:
when read-out fails after a read operation is performed using a read voltage level at the default level on the second memory group, performing a read operation at the first level;
when read-out fails after a read operation is performed at the first level on the second memory group, performing a read operation at a second level that is lower than the default level by a second read voltage offset; and
when read-out succeeds after a read operation is performed at the first level or the second level, updating the first and second mapping tables.

12. The method of claim 11, wherein the updating of the first mapping table comprises:

comparing the current POS with a first upper POS corresponding to the first read voltage offset and a second upper POS corresponding to the second read voltage offset;

when the current POS is not less than the first upper POS, performing a read operation in an order of the default level, the first level, and the second level on the second memory group, and when read-out succeeds at the first level, updating the first upper POS to the current POS and when read-out succeeds at the second level, updating the second upper POS to the current POS;

when the current POS is not less than the second upper POS and is less than the first upper POS, performing a read operation in an order of the first level, the second level, and the default level on the second memory group, and when read-out succeeds at the second level, updating the second upper POS to the current POS and when read-out succeeds at the default level, updating the first upper POS to the second upper POS; and when the current POS is less than the second upper POS, performing a read operation in an order of the second level, the default level, and the first level on the second memory group, and when read-out succeeds at the default level, initializing the first and second upper POSs and when read-out succeeds at the first level, initializing the second upper POS.

13. The method of claim 11, wherein the updating of the second mapping table comprises:

comparing the current POS with a first lower POS corresponding to the first read voltage offset and a second lower POS corresponding to the second read voltage offset;

when the current POS is not greater than the second lower POS, performing a read operation in an order of the second level, the first level, and the default level on the second memory group, and when read-out succeeds at the first level, updating the second lower POS to the current POS and when read-out succeeds at the default level, updating the first lower POS to the current POS;

when the current POS is not greater than the first lower POS and is greater than the second lower POS, performing a read operation in an order of the first level, the default level, and the second level on the second memory group, and when read-out succeeds at the default level, updating the first lower POS to the current POS and when read-out succeeds at the second level, updating the second lower POS to the first lower POS; and when the current POS is greater than the first lower POS, performing a read operation in an order of the default level, the second level, and the first level on the second memory group, and when read-out succeeds at the second level, initializing the first and second lower POSs and when read-out succeeds at the first level, initializing the first lower POS.

14. The method of claim 11, wherein when read-out fails after a read operation is performed on the second memory group at the first level or the second level, the method further comprises setting a flag so that a result of a read operation performed on the second memory group is not used to update the first and second mapping tables and performing a read retry operation for searching for a valley between two adjacent threshold voltage distributions of the second memory group.

15. A method of operating a memory device comprising a plurality of memory groups, the method comprising:

storing program order information that comprises a program order stamp (POS) indicating a program order of program operations of the plurality of memory groups;

storing a first mapping table that stores a read voltage offset and an upper POS corresponding to the read voltage offset, by performing a sequence of read operations on the memory device using a plurality of read voltage levels that are sequentially reduced;

storing a second mapping table that stores the read voltage offset and a lower POS corresponding to the read voltage offset, by performing a sequence of read operations on the memory device using a plurality of read voltage levels that are sequentially increased; and determining a read voltage for performing a read operation on the plurality of memory groups, based on the first and second mapping tables and the program order information, wherein a POS of value 1 is allocated to a memory group from among the plurality of memory groups on which a program operation is firstly performed, a POS of value 2 is allocated to a memory group on which a program operation is secondly performed, and a POS of value n is allocated to a memory group on which a program operation is nthly performed, wherein n is an integer greater than 2.

16. The method of claim 15, wherein the plurality of memory groups are divided according to units, the upper and lower POSs are allocated according to the units, and the first and second mapping tables respectively store the read voltage offset and the upper and lower POSs according to the units; and wherein the units comprise at least one of memory blocks and word lines.

* * * * *